(12) United States Patent
Noble et al.

(10) Patent No.: US 6,340,612 B1
(45) Date of Patent: Jan. 22, 2002

(54) METHOD OF FABRICATING BODY CONTACTED AND BACKGATED TRANSISTORS

(75) Inventors: Wendell P. Noble, Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/649,983

(22) Filed: Aug. 29, 2000

Related U.S. Application Data

(62) Division of application No. 09/050,275, filed on Mar. 30, 1998, now Pat. No. 6,229,342.

(51) Int. Cl.$^7$ ............................................. H01L 27/07
(52) U.S. Cl. ...................... 438/213; 438/218; 438/219; 438/233; 438/207; 438/311; 438/337
(58) Field of Search ................................. 438/129, 204, 438/205, 207, 213, 218, 219, 233, 311, 355, 325, 337, 340, 342, FOR 186, FOR 222, FOR 174

(56) References Cited

U.S. PATENT DOCUMENTS

| | | | |
|---|---|---|---|
| 4,450,048 A | 5/1984 | Gaulier | 204/15 |
| 4,673,962 A | 6/1987 | Chatterjee et al. | 357/23.6 |
| 4,987,089 A | 1/1991 | Roberts | 437/34 |
| 4,996,574 A | 2/1991 | Shirasaki | 357/23.7 |
| 5,006,909 A | 4/1991 | Kosa | 357/23.6 |
| 5,023,688 A * | 6/1991 | Ando et al. | |
| 5,097,381 A | 3/1992 | Vo et al. | 361/313 |
| 5,122,848 A | 6/1992 | Lee et al. | 357/23.6 |
| 5,250,450 A | 10/1993 | Lee et al. | 437/40 |
| 5,315,143 A | 5/1994 | Tsuji | 257/351 |
| 5,453,636 A | 9/1995 | Eitan et al. | 257/378 |
| 5,491,356 A | 2/1996 | Dennison et al. | 257/306 |
| 5,528,062 A | 6/1996 | Hsieh et al. | 257/298 |
| 5,541,432 A | 7/1996 | Tsuji | 257/350 |
| 5,554,870 A | 9/1996 | Fitch et al. | 257/334 |

(List continued on next page.)

OTHER PUBLICATIONS

Chen, M.J., et al., "Back–Gate Forward Bias Method for Low–Voltage CMOS Digital Cicuits", *IEEE Transactions on Electron Devices*, 43, 904–909, (Jun. 1996).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

(List continued on next page.)

*Primary Examiner*—George Fourson
*Assistant Examiner*—Thanh V Pham
(74) *Attorney, Agent, or Firm*—Schwegman, Lundberg, Woessner & Kluth, P.A.

(57) ABSTRACT

A circuit and method for an improved inverter is provided. The present invention capitalizes on a switched source impedance to prevent subthreshold leakage current at standby in low voltage CMOS circuits. The switched source impedance is provided by body contacted and backgated transistors. The gate and body of the transistors are biased to modify the threshold voltage of the transistors ($V_t$). This design provides fast switching capability for low power battery operated CMOS circuits and systems. The transistor structures offer the performance advantages from both metal-oxide semiconductor (MOS) and bipolar junction transistor (BJT) designs. The devices can be used in a variety of applications, digital and analog, wherever a more compact structure with low power consumption and fast response time is needed.

33 Claims, 22 Drawing Sheets

U.S. PATENT DOCUMENTS

| | | |
|---|---|---|
| 5,581,104 A | 12/1996 | Lowrey et al. |
| 5,585,998 A | 12/1996 | Kotecki et al. ........... 361/321.4 |
| 5,587,665 A | 12/1996 | Jiang ............................ 326/16 |
| 5,646,900 A | 7/1997 | Tsukude et al. ............. 365/205 |
| 5,680,345 A | 10/1997 | Hsu et al. ............... 365/185.01 |
| 5,689,121 A | 11/1997 | Kitagawa et al. ........... 257/139 |
| 5,691,230 A * | 11/1997 | Forbes |
| 5,796,143 A | 8/1998 | Fulford, Jr. et al. ........ 257/330 |
| 5,796,166 A | 8/1998 | Agnello et al. ............. 257/751 |
| 5,907,170 A | 5/1999 | Forbes et al. ............... 257/296 |
| 5,909,618 A | 6/1999 | Forbes et al. ............... 438/242 |
| 5,914,511 A | 6/1999 | Noble et al. ................. 257/302 |
| 5,936,274 A | 8/1999 | Forbes et al. ............... 257/315 |
| 5,973,356 A | 10/1999 | Noble et al. ................. 257/319 |
| 6,107,663 A * | 8/2000 | Noble et al. |
| 6,160,275 A * | 12/2000 | Nishio et al. |

OTHER PUBLICATIONS

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(1), 509–511, (Nov. 1996).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horiguchi, et al., "Switched–Source–Impedance CMOS Circuit for Low Standby Subthreshold Current Giga–Scale LSIs", *IEEE Journal of Solid State Circuits*, vol. 28, 1131–1135, (1993).

Huang, W.L., et al., "TFSOI Complementary BiCMOS Technology for Low Power Applications", *IEEE Transactions on Electron Devices*, 42, 506–512, (Mar. 1995).

Jaegar, et al., "A High Speed Sensing Scheme for IT Dynamic RAMs Utilizing the Clamped Bit–Line Sense Amplifier", *IEEE Journal of Solid State Circuits*, vol. 27, pp. 618–25 (1992).

Ko, et al., "High–gain Lateral Bipolar Action in a MOSFET Structure", *IEEE Trans. on Electron Devices*, vol. 38, No. 11, 2487–96, (Nov. 1991).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Parke, S.A., et al., "A High–Performance Lateral Bipolar Transistor Fabricated on SIMOX", *IEEE Electron Device Letters*, 14, 33–35, (Jan. 1993).

Rabaey, *Digital Integrated Circuits*, Prentice Hall, Englewood Cliffs, NJ, 222–232, (1996).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits*, 26(4), pp. 525–536, (Apr. 1991).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Tuinega, *A Guide to Circuit Simulation and Analysis Using PSPICE*, Prentice Hall, Englewood Cliffs, NJ, (1988).

Wong, et al., "A 1V CMOS Digital Circuits with Double–Gate Driven MOSFET", *IEEE Int. Solid State Circuits Conference*, San Francisco, 292–93, (1997).

Yilmaz, H., et al., "Recent Advances in Insulated Gate Bipolar Transistor Technology", *IEEE Transactions on Industry Applications*, 26(5), pp. 831–834, (Sep. 1990).

* cited by examiner

METHOD OF FABRICATING BODY CONTACTED AND BACKGATED TRANSISTORS

RELATED APPLICATIONS

This application is a division of U.S. patent application Ser. No. 09/050,275, filed on Mar. 30, 1998, the specification of which is incorporated herein by reference.

This application is related to the co-filed and commonly assigned application, U.S. Pat. No. 6,097,065, entitled "Circuits and Methods For Dual-Gated Transistors" and application Ser. No. 09/050,728, entitled "Another Technique for Gated Lateral Bipolar Transistors" which are hereby incorporated by reference.

FIELD OF THE INVENTION

The present invention relates generally to semiconductor integrated circuits. More particularly, it pertains to circuits and methods for body contacted and backgated transistors.

BACKGROUND OF THE INVENTION

Integrated circuit technology relies on transistors to formulate vast arrays of functional circuits. The complexity of these circuits requires the use of an ever increasing number of linked transistors. As the number of transistors required increases, the surface area that can be dedicated to a single transistor dwindles. It is desirable then, to construct transistors which occupy less surface area on the silicon chip/die.

Integrated circuit technology uses transistors conjunctively with Boolean algebra to create a myriad of functional digital circuits, also referred to as logic circuits. In a typical arrangement, transistors are combined to switch or alternate an output voltage between just two significant voltage levels, labeled logic 0 and logic 1. Most logic systems use positive logic, in which logic 0 is represented by zero volts, or a low voltage, e.g., below 0.5 V; and logic 1 is represented by a higher voltage.

One method in which these results are achieved involves Complementary Metal-Oxide Semiconductor (CMOS) technology. CMOS technology comprises a combination of oppositely doped Metal-Oxide Semiconductor Field-Effect Transistors (MOSFETs) to achieve the switching mechanism between voltage levels associated with logic 0 and that of logic 1. This configuration is likewise referred to as an inverter. Conventional CMOS inverters consume an appreciable amount of chip surface area, even despite ongoing reductions in the critical dimensions that are achievable with conventional photolithography techniques. The critical dimension (F) represents the minimum lithographic feature size that is imposed by lithographic processes used during fabrication. It is one objective, then, to fabricate CMOS inverters which conserve silicon chip surface space.

Standby current is another significant concern and problem in low voltage and low power battery operated CMOS circuits and systems. High threshold voltage transistors and high power supply voltages were traditionally employed in part to minimize subthreshold leakage at standby. Today, however, low voltages are desired for low power operation and this creates a problem with threshold voltages and standby leakage current. In order to get significant overdrive and reasonable switching speeds the threshold voltage ($V_t$) magnitudes must be small, e.g. zero volts. However, having such low threshold voltages generally causes one of the transistors to have a large subthreshold leakage current. Various techniques have been employed to allow low voltage operation with CMOS transistors and maintain low subthreshold leakage currents at standby.

Dynamic CMOS circuits achieve this objective using clock or phase voltages to turn off conduction from the power supply to ground through the chain of devices when the inverter is at standby. Synchronous body bias has similarly been employed in part to minimize subthreshold leakage. However, synchronous body bias, like dynamic logic, requires extra clock or phase voltage lines throughout the circuit. This increases considerably the complexity of circuits and consumes precious space on the chip. Also, data stored only on a dynamic basis must be clocked and refreshed.

Another way to get around these problems involves implementing resistors to provide a source to substrate bias or backgate bias when the transistor is in the off state or, in other words, to create a "switched source impedance." The problem with this method is that resistors are troublesome to fabricate in CMOS process steps.

For the reasons stated above, and for other reasons stated below which will become apparent to those skilled in the art upon reading and understanding the present specification, there is a need to develop improved inverter devices. The devices should desirably minimize subthreshold leakage current and conserve chip surface space while continuing to advance the operation speeds in logic circuits. The improved inverter circuits and structures should remain fully integral with CMOS processing techniques.

SUMMARY OF THE INVENTION

The above mentioned problems with memory devices and other problems are addressed by the present invention and will be understood by reading and studying the following specification. A circuit and method is provided to minimize subthreshold leakage currents at standby in low power CMOS circuits and systems.

In particular, an illustrative embodiment of the present invention includes an inverter. The inverter includes a first, second, third, and fourth transistor. Each of the transistors extends outwardly from a semiconductor substrate. Each of the four transistors has an upper surface and opposing sidewall surfaces. Each of the transistors includes a source/emitter region, a body/base region, and a collector/drain region. An electrical contact couples between the collector/drain regions of the second and third transistors to provide an output for the inverter. A gate contact interconnects the four transistors and provides an input to the inverter.

In another embodiment, a logic circuit is provided. The logic circuit includes multiple inverters that form an array. Each of the inverters includes a first, second, third, and fourth transistor. Each of the four transistors has an upper surface and opposing sidewall surfaces. Each of the transistors includes a source/emitter region, a body/base region, and a collector/drain region. An electrical contact couples between the collector/drain regions of the second and third transistors to provide an output for the inverter. A gate contact connects the four transistors and provides an input to the inverter. A metallization layer selectively interconnects the inputs and outputs of the inverters to implement a logic function. The logic circuit accepts inputs and produces one or more logical outputs.

In another embodiment, an input/output device is provided. The input/output device includes a functional circuit that has a plurality of components. A logic device is coupled to the functional circuit. The logic device has a number of inverters and each inverter has a first, second, third, and fourth transistor. Each of the transistors extends outwardly from a semiconductor substrate. Each of the four transistors has an upper surface and opposing sidewall surfaces. Each of the transistors includes a source/emitter region, a body/base region, and a collector/drain region. An electrical contact couples between the collector/drain regions of the second and third transistors to provide an output for the inverter. A gate contact connects the four transistors and provides an input to the inverter. A metallization layer is also provided that selectively interconnects the inputs and outputs of the inverters to form a logic circuit that accepts inputs and produces one or more logical outputs.

In another embodiment, a method of fabricating an inverter is provided. The method includes forming a first, second, third, and fourth transistor. The four transistors are formed to extend outwardly from a semiconductor substrate. The transistors are each formed with an upper surface and opposing sidewall surfaces. The transistors are formed to include a source/emitter region, a body/base region, and a collector/drain region. An electrical contact is formed between collector/drain regions of the second and third transistors to provide an output for the inverter. A gate contact is formed which interconnects the transistors. The gate contact provides an input to the inverter.

In another embodiment, a method of fabricating an array of inverters is provided. The method includes forming multiple inverters such that each of the inverters is formed as described above. A metallization layer is formed that selectively interconnects the inputs and outputs of the inverters to form a logic circuit. The logic circuit accepts inputs and produces one or more logical outputs.

Thus, an improved circuit and method is provided. The transistors combine BJT and MOS transistor conduction. The new circuit and method allows for low voltage level operation and enhanced switching action over conventional bipolar complementary metal-oxide semiconductor (BiCMOS) devices. The new circuit and method additionally minimizes the subthreshold leakage current at standby. The transistor structure and circuit are fully compatible with CMOS technology. Thus, the transistor structures do not require additional chip surface space, nor additional processing steps.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 4A–4M illustrate an embodiment of a process of fabrication of an inverter according to the teachings of the present invention. current sense amplifier.

DETAILED DESCRIPTION

Figure 1A:
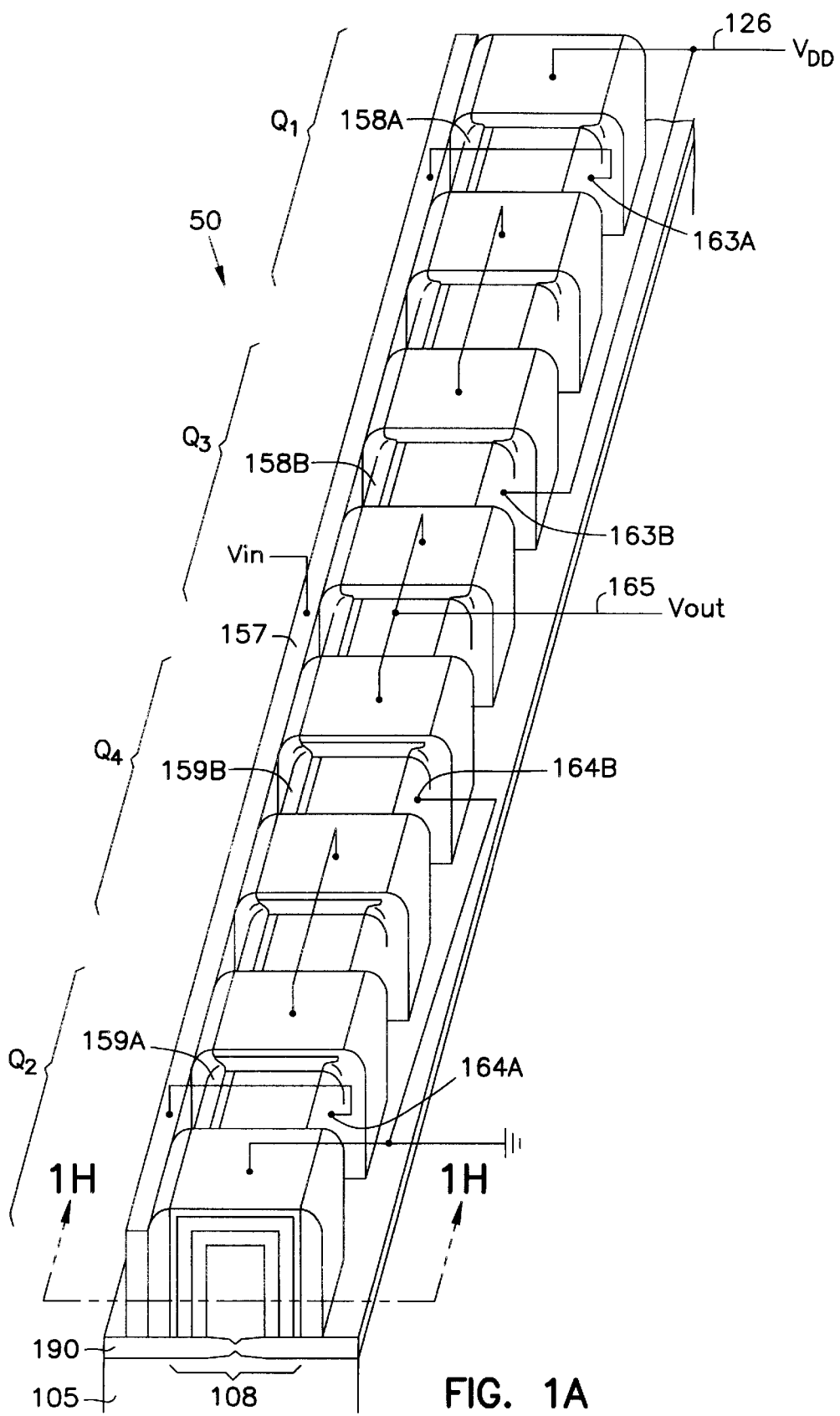
FIG. 1A is a perspective view illustrating an inverter according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

Inverter Embodiment

FIG. 1A is a perspective view illustrating generally an embodiment of an inverter according to the teachings of the present invention. The inverter 50 is a four transistor device that is formed using, for example, the technique described below with respect to FIGS. 4A through 4M. The transistors which make up the inverter 50 are formed of single crystalline semiconductor material 108. Each transistor in inverter 50 is either an n-channel metal-oxide semiconductor (NMOS) or a p-channel metal-oxide semiconductor (PMOS). The inverter 50 includes two NMOS transistors, $Q_2$ and $Q_4$ respectively. The NMOS transistors, $Q_2$ and $Q_4$, are coupled to one another. Also, the inverter 50 includes two PMOS transistors, $Q_1$ and $Q_3$ respectively. The PMOS transistors, $Q_1$ and $Q_3$, are likewise coupled to one another. In the exemplary embodiment, NMOS transistors $Q_2$ and $Q_4$ possess different doping profiles such that transistor $Q_2$ has a higher threshold voltage ($V_t$) than transistor $Q_4$. PMOS transistors $Q_1$ and $Q_3$ possess different doping profiles such that transistor $Q_1$ has a higher threshold voltage ($V_t$) than transistor $Q_3$. NMOS transistors, $Q_2$ and $Q_4$, include gates 159A and 159B respectively. PMOS transistors, $Q_1$ and $Q_3$, include gates 158A and 158B respectively. In one embodiment, the NMOS gates, 159A and 159B, are formed of n+ silicon material and the PMOS gates, 158A and 158B, are formed of p+ silicon material. NMOS transistors, $Q_2$ and $Q_4$, include body contacts 164A and 164B respectively. PMOS transistors, $Q_1$ and $Q_3$, include body contacts 163A and 163B respectively. In one embodiment, the NMOS body contacts, 164A and 164B, are formed of p+ silicon material and the PMOS body contacts, 163A and 163B, are formed of n+ silicon material. The body contacts, 164B and 163B, of transistors $Q_4$ and $Q_3$ couple to external potential values. Inverter 50 also includes a gate contact 157 which couples to all of the gates, 159A, 159B, 158A, and 158B, of the NMOS and PMOS transistors. Inverter 50 includes an electrical contact 165 which couples to transistors $Q_4$ and $Q_3$ and provides an output to the inverter 50. In one embodiment, inverter 50 is formed on an insulator layer 190 formed on a substrate 105 of p− silicon material. In one embodiment, gate contact 157 further couples to the body contacts, 164A and 163A, of transistors $Q_2$ and $Q_1$.

Figure 1B:
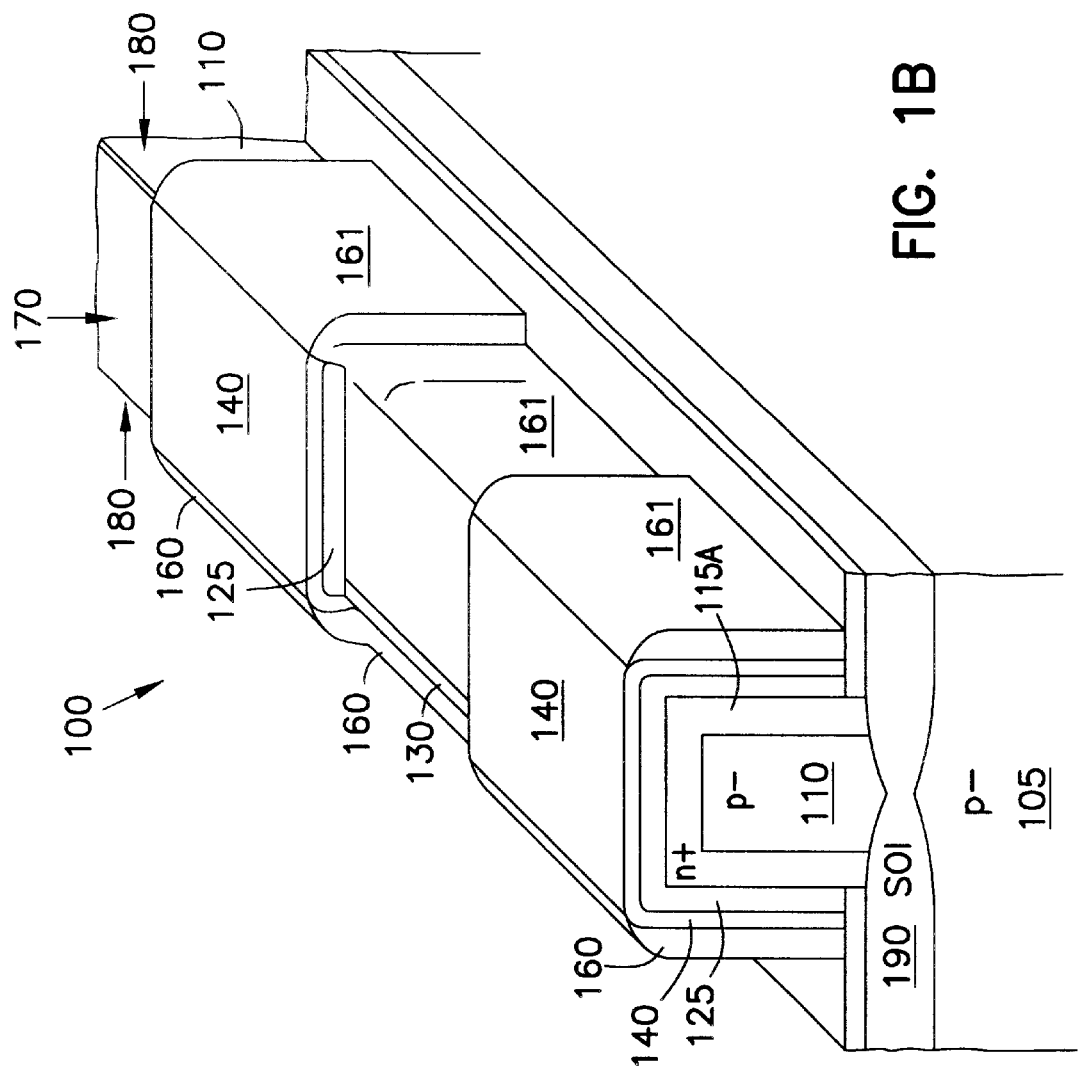
FIG. 1B is a perspective view intended to provide an illustrative example of an individual NMOS transistor as employed in the inverter of FIG. 1A.

FIG. 1B is a perspective view intended to provide an illustrative example of an individual NMOS transistor 100 as employed in the inverter 50 of FIG. 1A. The NMOS transistor 100 represents either transistor $Q_2$ or $Q_4$ in inverter 50 depending on the NMOS transistor's doping profile. The NMOS transistor 100 includes a body region 110 formed of single crystalline semiconductor material that extends outwardly from a substrate 105. In one embodiment, the body region 110 is formed on an insulator layer 190 formed on a substrate 105 formed of p− silicon material. The body region 110 has an upper surface 170 and opposing sidewall surfaces 180. In one embodiment, the NMOS body region 110 is formed of a p− silicon material. A source/emitter region 115A is formed within the upper surface 170 and the opposing sidewall surfaces 180 of the body region 110 of the NMOS transistor 100. Similarly, a collector/drain region 115B (FIG. 1C) is formed within the upper surface 170 and the opposing sidewall surfaces 180 of the body region 110 of the NMOS transistor 100. A doped glass layer 125 encases both the source/emitter region 115A and the collector/drain region 115B for the transistor. In one embodiment the doped glass layer 125 is Arsenic silicate glass (ASG), and in another embodiment, the doped glass layer is phosphorus silicate glass (PSG). A thin nitride layer 140 encases the doped glass layer 125 over the source/emitter region 115A and the collector/drain region 115B.

The NMOS transistor 100 further includes a gate oxide layer 130 located on a first one of the opposing sidewalls 180. A gate 160 is formed on the gate oxide 130 on the first one of the opposing sidewalls 180. Gate 160 correlates to either gate 159A or 159B of FIG. 1A depending on the gate's 160 doping profile. A body contact 161 is located on the other of the opposing sidewall surfaces 180. Body contact 161 correlates to either body contact 164A or 164B of FIG. 1A depending on the body contact's 161 doping profile.

Figure 1C:
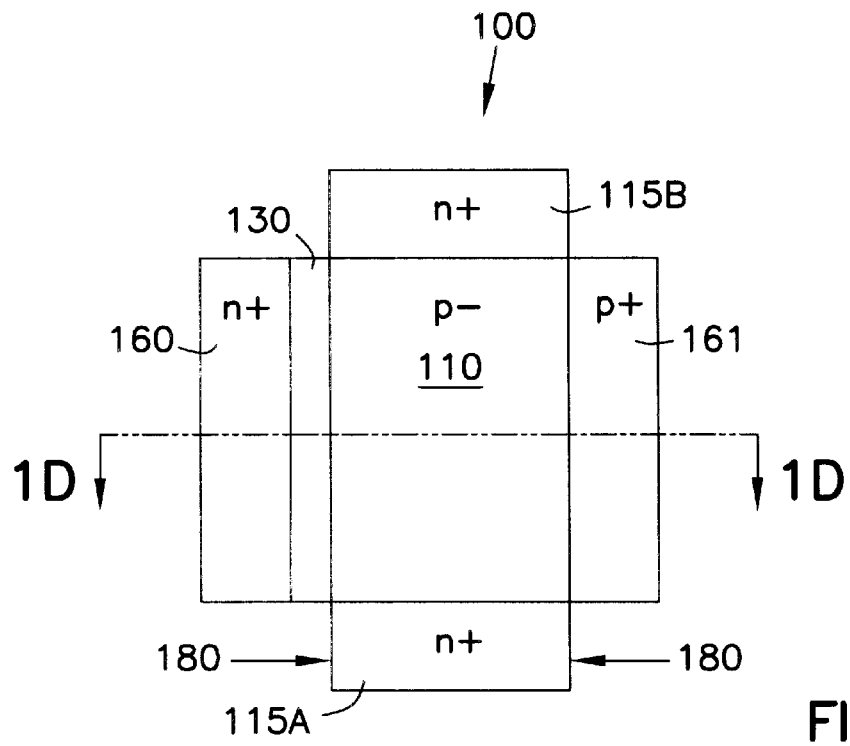
FIG. 1C is a top view of the transistor shown in FIG. 1B.

FIG. 1C is a top view of the transistor shown in FIG. 1B with the nitride layer 140 and the doped glass layer 125 cut away for illustrative purposes. FIG. 1C illustrates the source/emitter region 115A and the collector/drain region 115B. FIG. 1C also illustrates the gate oxide 130 located on a first one of the opposing sidewall surfaces 180, and further, the gate 160 formed on the gate oxide 130. The body contact 161 is shown coupling directly to the other one of the opposing sidewall surfaces 180.

Figure 1D:
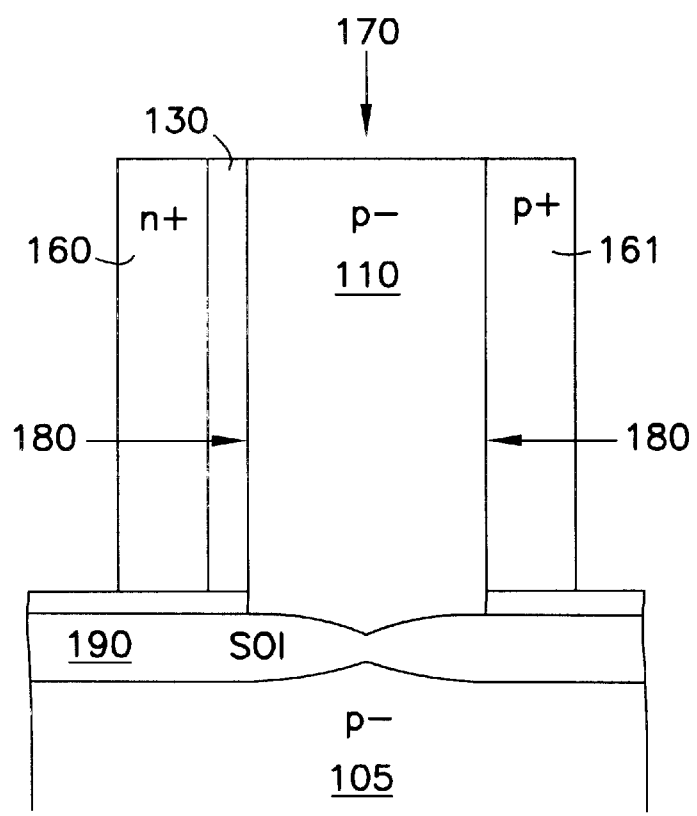
FIG. 1D is a cross-sectional view taken along cut line 1D—1D of FIG. 1C.

FIG. 1D is a cross-sectional view taken along cut line 1D—1D of FIG. 1C. This cross-sectional view provides another illustration of the gate 160 formed on the gate oxide 130 on one of the opposing sidewall surfaces 180. The view likewise shows the body contact 161 coupling directly to the body region 110 through the other opposing sidewall 180. In one embodiment, the gate 160 and the body contact 161 are biased independently from one another. In an alternative embodiment, the gate 160 and the body contact 161 are coupled to a single source potential.

Figure 1E:
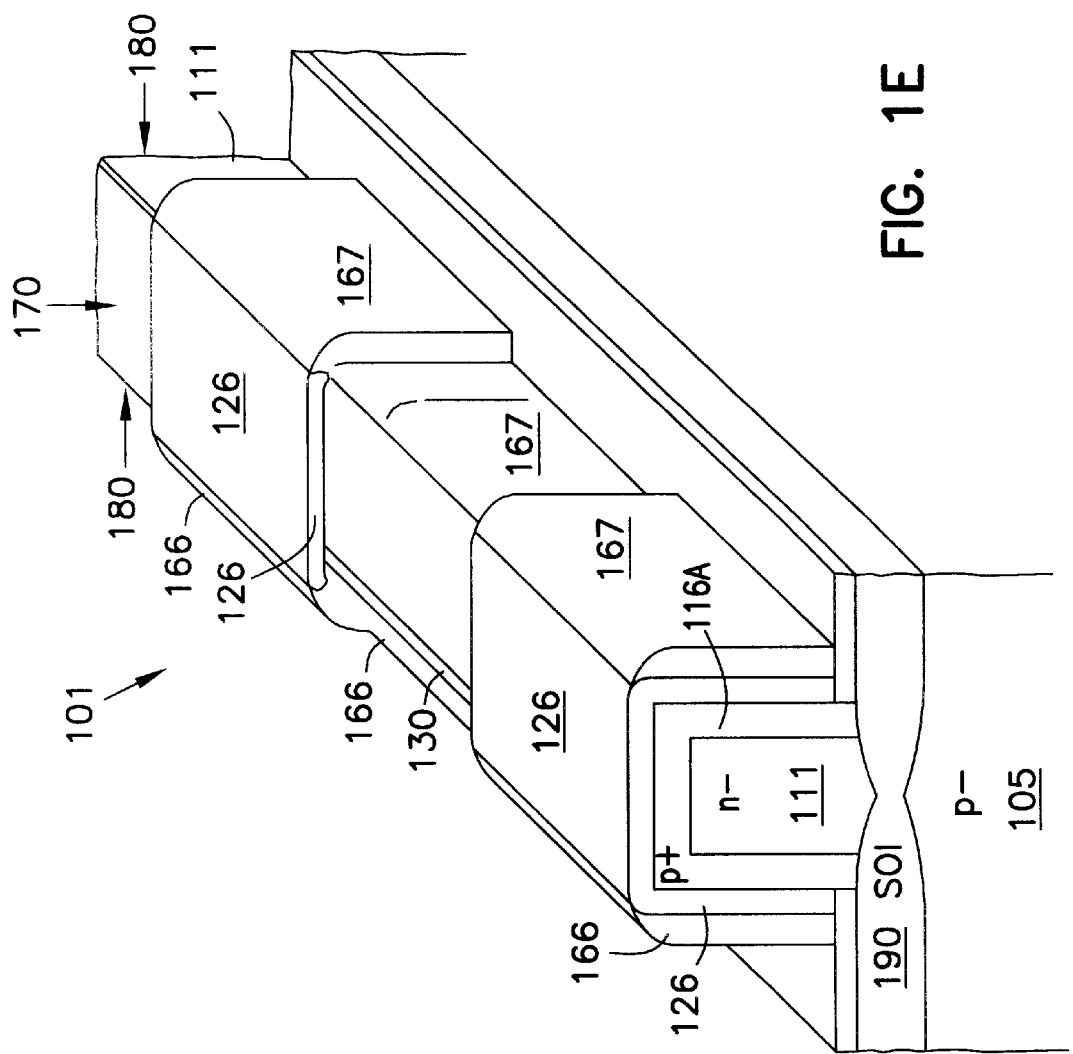
FIG. 1E is a perspective intended to provide an illustrative example of an individual PMOS transistor as employed in the inverter of FIG. 1A.

FIG. 1E is a perspective intended to provide an illustrative example of an individual PMOS transistor 101 as employed in the inverter 50 of FIG. 1A. The PMOS transistor 101 represents either transistor $Q_1$ or $Q_3$ in inverter 50 depending on the PMOS transistor's 101 doping profile. The PMOS transistor 101 includes a body region 111 formed of single crystalline semiconductor material that extends outwardly from a substrate 105. In one embodiment, the body region 111 is formed on an insulator layer 190. Insulator layer 190 is formed on a substrate 105. Substrate 105 comprises, for example, p− silicon material. The body region 111 has an upper surface 170 and opposing sidewall surfaces 180. In one embodiment, the PMOS body region 111 is formed of an n− silicon material. A source/emitter region 116A is formed within the upper surface 170 and the opposing sidewall surfaces 180 of the body region 111 of the PMOS transistor 101. Similarly, a collector/drain region 116B (not shown) is formed within the upper surface 170 and the opposing sidewall surfaces 180 of the body region 111 of the PMOS transistor 101. A doped glass layer 126 encases both the source/emitter region 116A and the collector/drain region 116B for the transistor. In one embodiment the doped glass layer 126 is borosilicate glass (BSG). The PMOS transistor 101 further includes a gate oxide layer 130 located on a first one of the opposing sidewalls 180. A gate 166 is formed on the gate oxide 130 on the first one of the opposing sidewalls 180. Gate 166 correlates to either gate 158A or 158B of FIG. 1A depending on the gate's 166 doping profile. A body contact 167 is located on the other of the opposing sidewall surfaces 180. Body contact 167 correlates to either body contact 163A or 163B of FIG. 1A depending on the body contact's 167 doping profile.

Figure 1F:
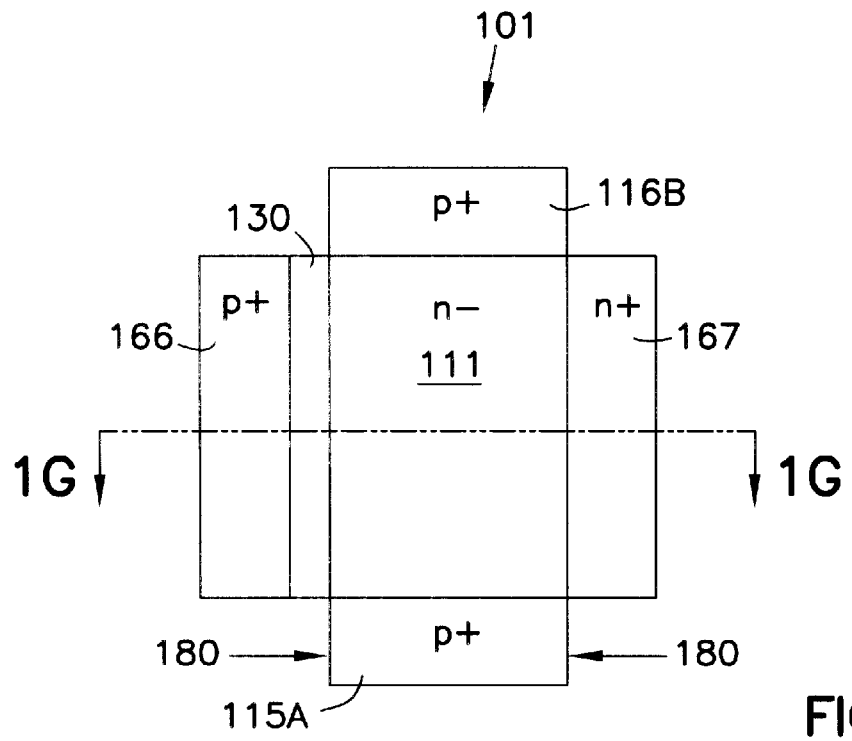
FIG. 1F is a top view of the transistor shown in FIG. 1E.

FIG. 1F is a top view of the transistor shown in FIG. 1E with the doped glass layer 126 cut away for illustrative purposes. FIG. 1F illustrates the source/emitter region 116A and the collector/drain region 116B. FIG. 1F also illustrates the gate oxide 130 located on a first one of the opposing sidewall surfaces 180, and further, the gate 166 formed on the gate oxide 130. The body contact 167 is shown coupling directly to the other one of the opposing sidewall surfaces 180.

Figure 1G:
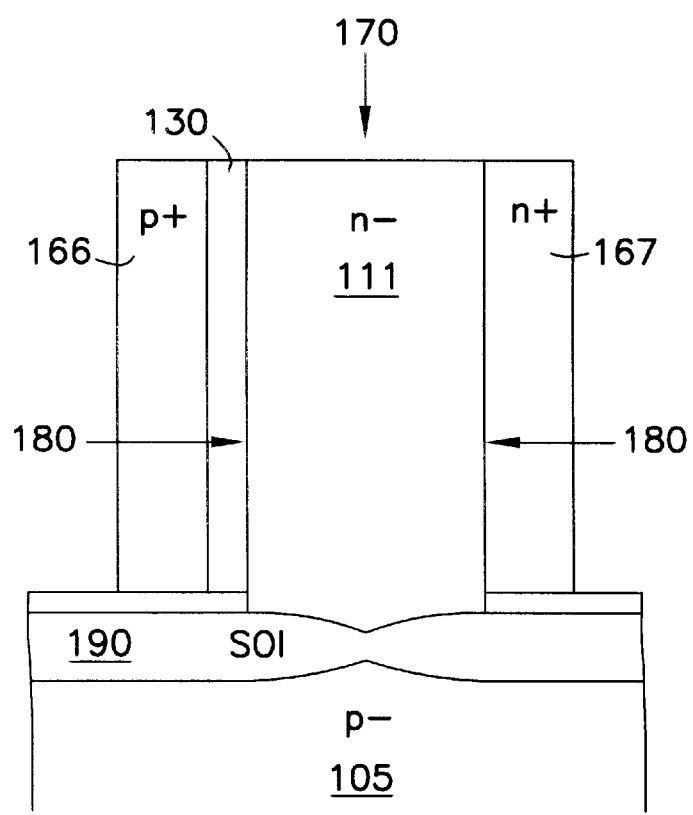
FIG. 1G is a cross-sectional view of the transistor shown in FIG. 1F, taken along cut line 1G—1G.

FIG. 1G is a cross-sectional view taken along cut line 1G—1G of FIG. 1F. This cross-sectional view provides another illustration of the gate 166 formed on the gate oxide 130 on one of the opposing sidewall surfaces 180. The view likewise shows the body contact 167 coupling directly to the body region 111 through the other opposing sidewall 180. In one embodiment, the gate 166 and the body contact 167 are biased independently from one another. In an alternative embodiment, the gate 166 and the body contact 167 are coupled to a single source potential.

Figure 1H:
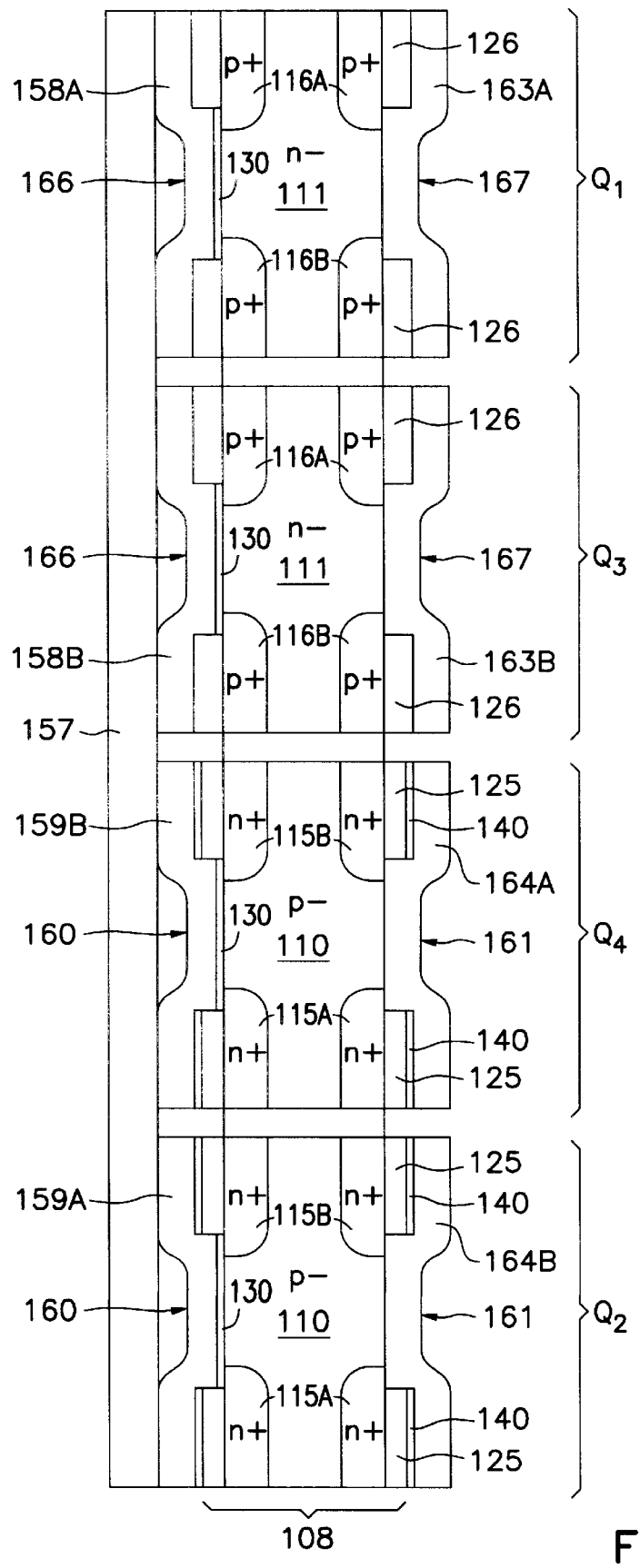
FIG. 1H is a cross-sectional view taken along cut line 1H—1H of FIG. 1A.

FIG. 1H is a cross-sectional view taken along cut line 1H—1H of FIG. 1A. FIG. 1H illustrates all four transistors, $Q_2$, $Q_4$, $Q_3$, and $Q_1$, coupled together via gate contact 157. FIG. 1H illustrates more clearly the gates, 159A and 159B respectively, coupling to the gate oxides 130 on one of the opposing sidewall surfaces 180. FIG. 1H shows that the gates, 159A and 159B respectively, of transistors $Q_2$ and $Q_4$ are both separated from coupling to the source/emitter regions 115A and the collector/drain regions 115B by a nitride layer 140 and by doped glass layers 125. Similarly, FIG. 1H illustrates more clearly that the body contacts, 164A and 164B respectively, couple directly to the body regions 110 on the other of the opposing sidewall surfaces 180. FIG. 1H shows that the body contacts, 164A and 164B respectively, of transistors $Q_2$ and $Q_4$ are also both separated from coupling to the source/emitter regions 15A and the collector/drain regions 115B by a nitride layer 140 and by doped glass layers 125.

FIG. 1H illustrates a similar arrangement for the PMOS transistors, $Q_1$ and $Q_3$ respectively. FIG. 1H shows more clearly the gates, 158A and 158B respectively, coupling to the gate oxides 130 on one of the opposing sidewall surfaces 180. FIG. 1H shows that the gates, 158A and 158B respectively, of transistors $Q_1$ and $Q_3$, are both separated from coupling to the source/emitter regions 116A and the collector/drain regions 116B by doped glass layers 126. Similarly, FIG. 1H illustrates more clearly that the body contacts, 163A and 163B respectively, couple directly to the body regions 111 on the other of the opposing sidewall surfaces 180. FIG. 1H shows that the body contacts, 163A and 163B respectively, of transistors $Q_1$ and $Q_3$ are also separated from coupling to the source/emitter regions 116A and the collector/drain regions 116B by the doped glass layers 126.

Figure 1I:
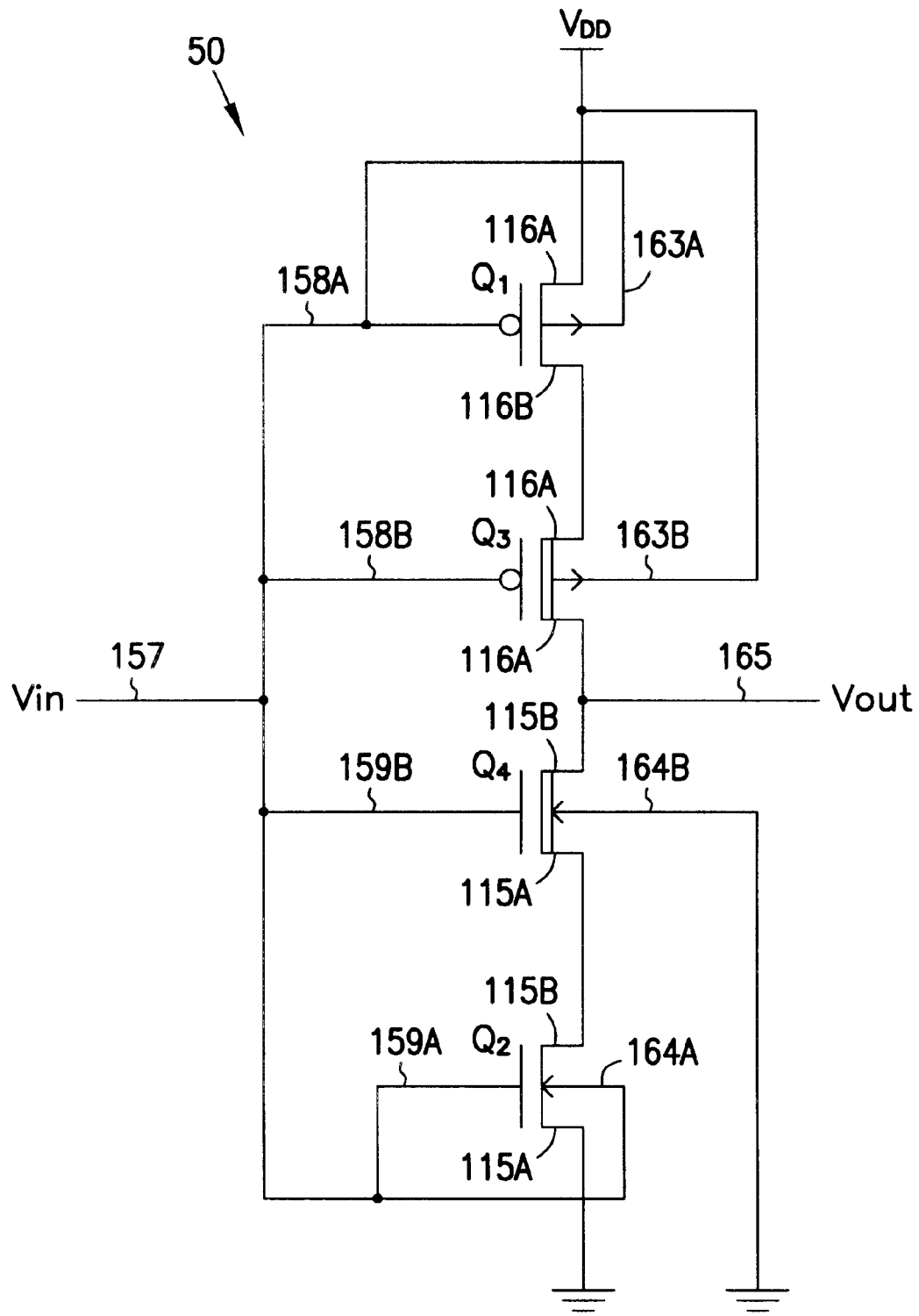
FIG. 1I a schematic diagram of an inverter according to the teachings of the present invention.

FIG. 1I is a schematic diagram of an inverter 50 according to the teachings of the present invention. The operation of the embodiment of FIG. 1A is described in connection with the schematic diagram of FIG. 1I. In operation, inverter 50 receives a "high" or "low" voltage input corresponding to a logic "1" or logic "0", which is carried by the gate contact 157 to all of the gates, 159A, 159B, 158B, and 158A respectively. The operation of any of the transistors, $Q_2$, $Q_4$, $Q_3$, or $Q_1$ respectively, is given by the application of this potential to those gates. A potential value is simultaneously applied to the body contacts, 164A, 164B, 163B and 163A respectively, of the inverter 50. Conduction then occurs between the source/emitter region, 115A or 116A, and the collector/drain region, 115B or 116B, of the responsive transistors.

At low values of potential applied to the gates, e.g., close to the threshold potential ($V_t$), the responsive transistors, amongst $Q_2$, $Q_4$, $Q_3$, or $Q_1$, exhibit metal-oxide semiconductor (MOS) conduction action and the majority of this conduction occurs in the inversion region adjacent to the gates of the responsive transistors. In this instance, applying a potential to the body contacts serves primarily to change the threshold voltage of the MOS conduction action. For greater potentials applied to the gates, e.g., larger than $V_t$, the responsive transistors, amongst $Q_2$, $Q_4$, $Q_3$, or $Q_1$, exhibit distinct bipolar junction transistor (BJT) conduction action in addition to the MOS conduction action. For even higher potentials applied to the gates, e.g., much greater than $V_t$, the BJT conduction action dominates.

In the exemplary embodiment, the body contacts 164A and 163A of transistors $Q_2$ and $Q_1$ couple to the gate contact 157 or to the transistors respective gates 159A and 158A. Additionally, these transistors possess a higher threshold voltage level ($V_t$) than do transistors $Q_4$ and $Q_3$. When off, transistors $Q_2$ and $Q_1$ provide a high impedance in the source/emitter regions 115A and 116A of transistors $Q_4$ and $Q_3$. This high impedance is also termed a "switched source impedance." When the gate-body connected transistors $Q_2$ and $Q_1$ are turned on their threshold voltage ($V_t$) magnitude decreases and they can in fact become depletion mode devices with a large excess in the magnitude of gate voltage over $V_t$. In this state the gate-body connected transistors $Q_2$ and $Q_1$ have a very low on state resistance and there is only a small degradation in the switching speed of the inverter 50 due to the additional resistance and capacitive load. These circuits do not require extra phase or clock voltages and lines in the cell as synchronous body bias methods and circuits do.

Figure 2:
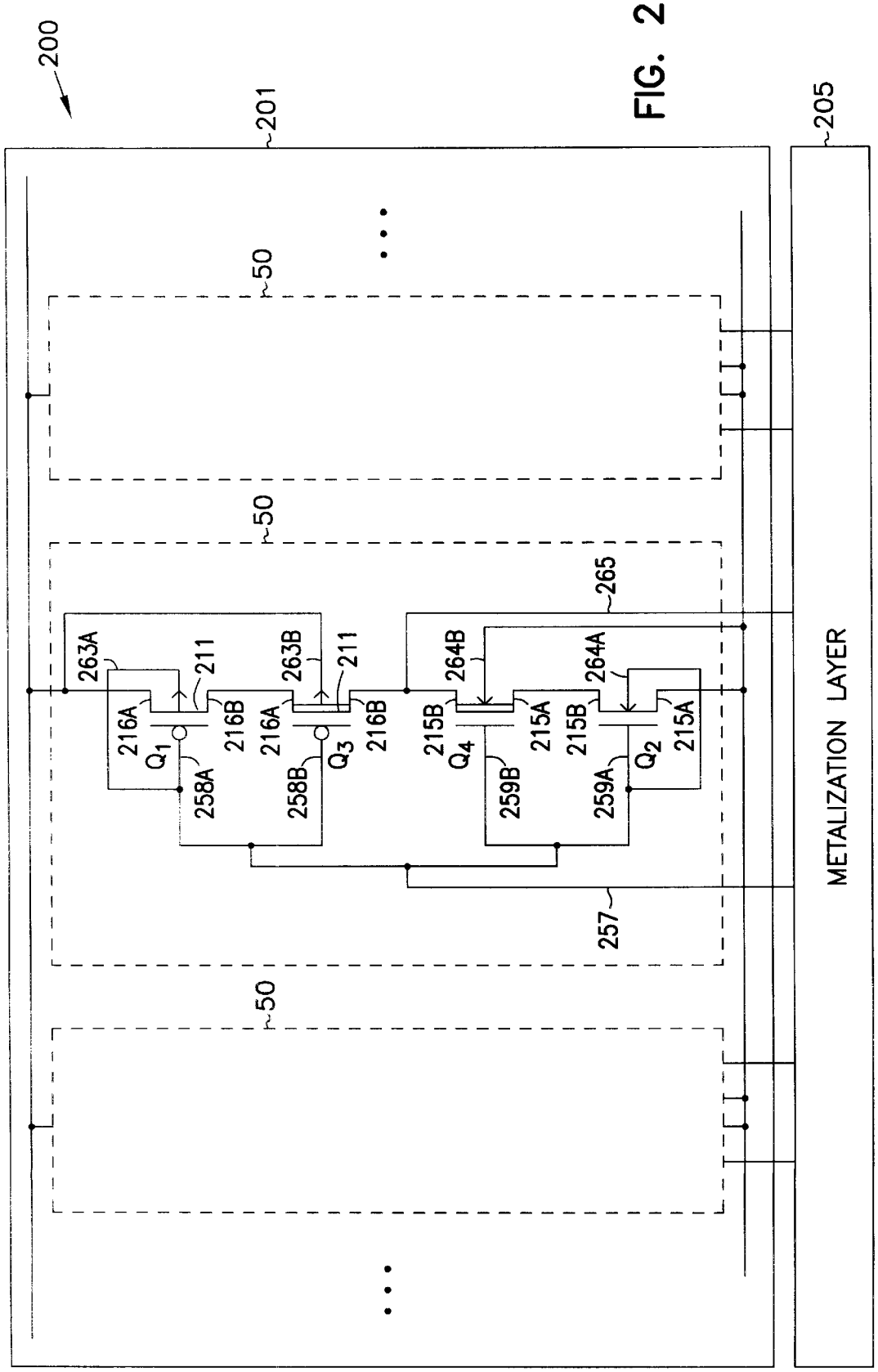
FIG. 2 is a schematic diagram illustrating an inverter array included as part of a logic circuit according to the teachings of the present invention.

FIG. 2 is a schematic diagram illustrating, by way of example and not by way of limitation, an inverter array 201 included as part of a logic circuit 200 according to the teachings of the present invention. Inverter array 201 contains multiple inverters exemplified by inverter 50. Each transistor, $Q_2$, $Q_4$, $Q_3$, or $Q_1$ respectively, in inverter 50 has a selected doping profile to achieve a desired threshold voltage. Each transistor in inverter 50 is either an n-channel metal-oxide semiconductor (NMOS) or a p-channel metal-oxide semiconductor (PMOS). The inverter 50 includes two NMOS transistors, $Q_2$ and $Q_4$ respectively. The NMOS transistors, $Q_2$ and $Q_4$, are coupled to one another. Also, the inverter 50 includes two PMOS transistors, $Q_1$ and $Q_3$ respectively. The PMOS transistors, $Q_1$ and $Q_3$, are likewise coupled to one another. In the exemplary embodiment, NMOS transistors $Q_2$ and $Q_4$ possess different doping profiles such that transistor $Q_2$ has a higher threshold voltage ($V_t$) than transistor $Q_4$. PMOS transistors $Q_1$ and $Q_3$ possess different doping profiles such that transistor $Q_1$ has a higher threshold voltage ($V_t$) than transistor $Q_3$. NMOS transistors, $Q_2$ and $Q_4$, include gates 259A and 259B respectively. PMOS transistors, $Q_1$ and $Q_3$, include gates 258A and 258B respectively. NMOS transistors, $Q_2$ and $Q_4$, include body contacts 264A and 264B respectively. PMOS transistors, $Q_1$ and $Q_3$, include body contacts 263A and 263B respectively. The body contacts, 264B and 263B, of transistors $Q_4$ and $Q_3$ couple to external potential values. Inverter 50 also includes a gate contact 257 which couples to all of the gates, 259A, 259B, 258A, and 258B respectively, of the NMOS and PMOS transistors. Inverter 50 includes an electrical contact 265 which couples to transistors $Q_4$ and $Q_3$ and provides an output to the inverter 50. In one embodiment, gate contact 257 further couples to the body contacts, 264A and 263A, of transistors $Q_2$ and $Q_1$.

In one embodiment, the gate contacts 257 and electrical contacts 265 of selected inverters 50 can be interconnected. The selected interconnection is made through a patterned metallization layer 205 which is coupled to inputs and outputs of selected inverters. The order of interconnection of the inverters will determine the output of logic circuit 200. The metallization layer 205 can be configured to interconnect other transistors such as to perform basic boolean logic functions such as AND, OR and NOT functions. By order of arrangement, the basic boolean logic functions can be combined such that the combination of these transistors and inverter circuit 200 yields desired logic functions.

Figure 3:
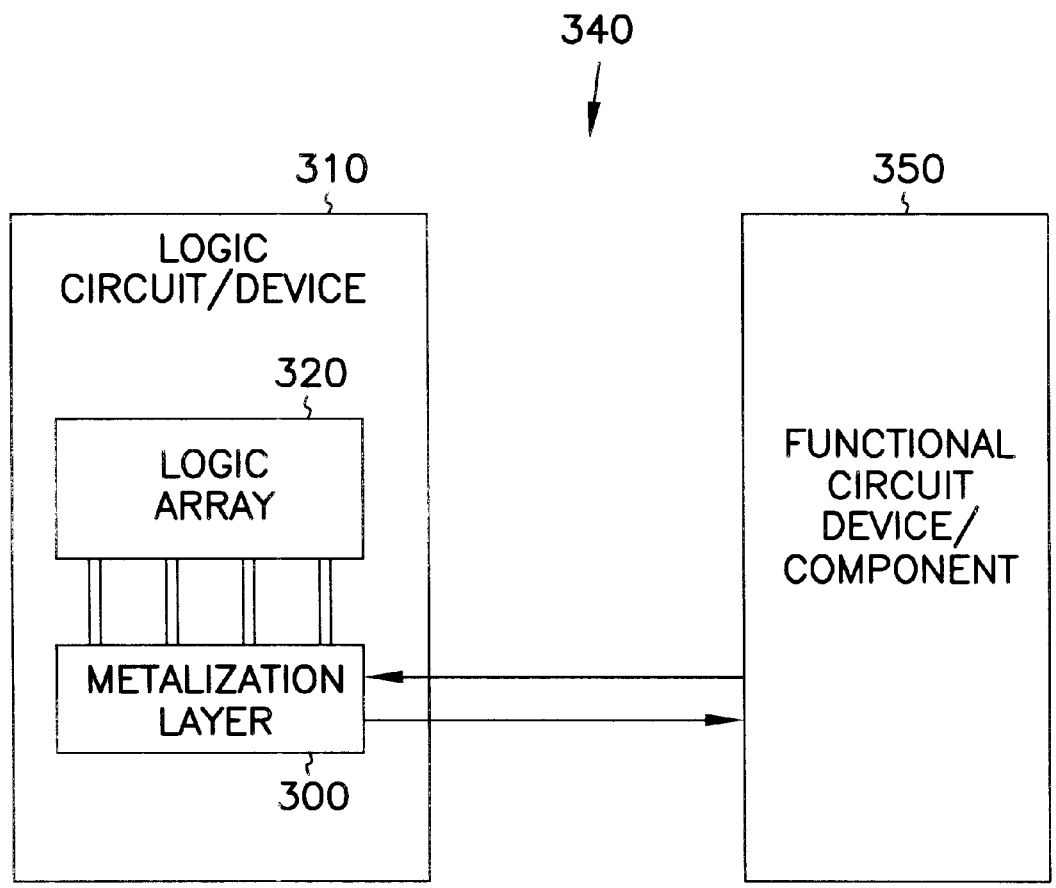
FIG. 3 is a block diagram illustrating a functional circuit according to the teachings of the present invention.

FIG. 3 is a block diagram illustrating a functional circuit 340 according to the teachings of the present invention. FIG. 3 illustrates the use of an inverter in a logic array 320 in a functional circuit 340. The individual inverters within the logic array 320 are selectively interconnected. The selected interconnection is made through a patternized metallization layer 300 which is coupled to inputs and outputs of selected individual inverters. The selected interconnection of individual inverters in the inverter array 320 through the metallization layer 300 forms logic circuit/device 310. The logic circuit/device 310 is electrically interconnected to other functional circuit device/components 350. These other functional circuit devices/components include memory controllers, microprocessors and input/output bus units.

Method of Fabrication for the Embodiment

Figure 4A:
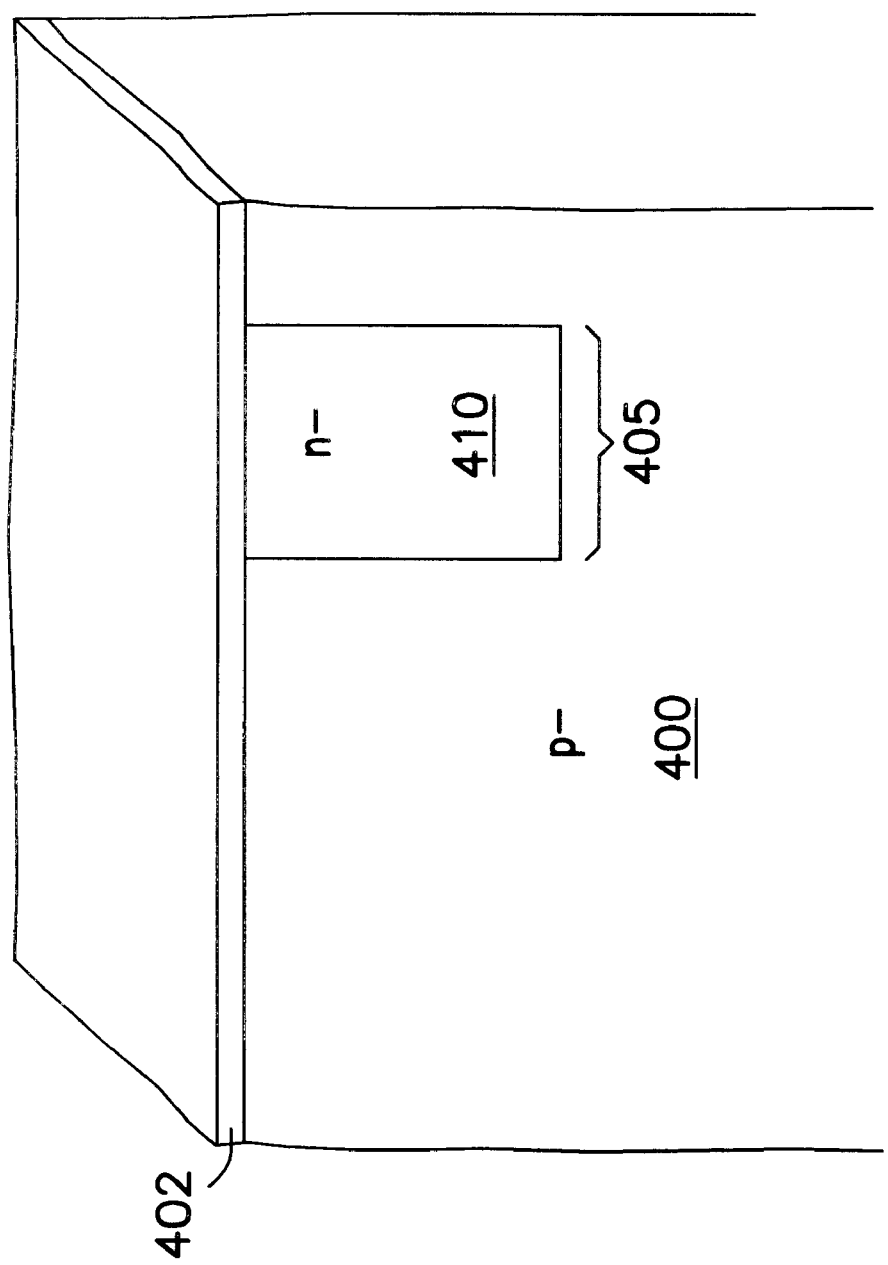

FIGS. 4A through 4M illustrate an embodiment of the various processing steps for fabricating a inverter formed from a complementary pair of body contacted and backgated transistors. FIG. 4A begins with a lightly doped p– silicon substrate 400. A thin screen oxide layer 402 is thermally grown. The oxide layer 402 is formed to a thickness of approximately 10 nanometers (nm). A photoresist is applied and selectively exposed to reveal p-channel metal-oxide semiconductor (PMOS) device regions 405. Wells of n-type silicon material are formed in the substrate 400 to form the PMOS device regions 405. The n-wells 410 of n-type material can be formed by any suitable method, such as by ion implantation. The n-wells 410 are formed to a depth of approximately 1.0 micrometer ($\mu$m). The photoresist is removed using conventional photoresist stripping techniques. The structure is then annealed, such as by a rapid thermal anneal (RTA) process, to achieve the desired doping profile. The structure is now as it appears in FIG. 4A.

Figure 4B:
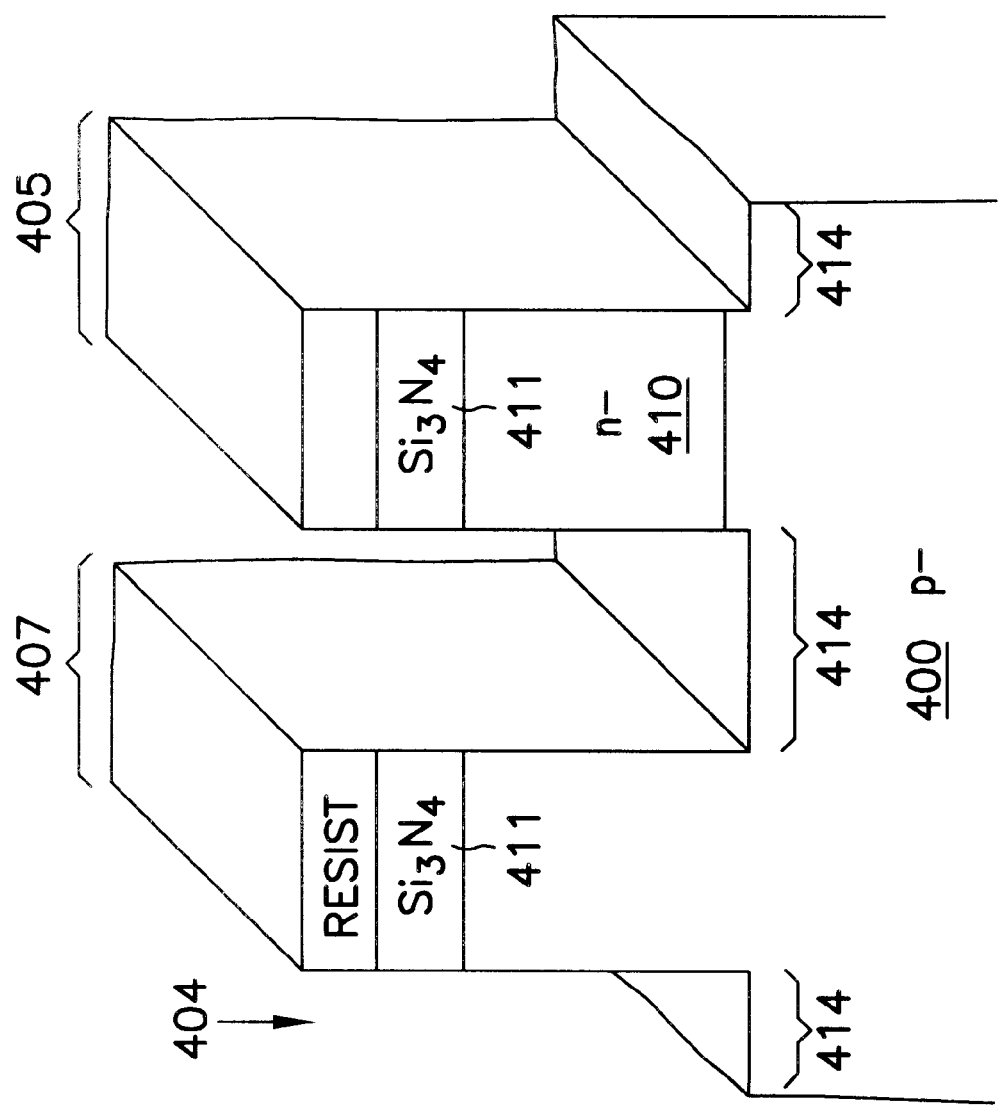

FIG. 4B illustrates the structure after the next sequence of processing steps. A silicon nitride ($Si_3N_4$) pad layer 411 is deposited on the upper surface 404 of the substrate 400 and the n-wells 410. The nitride layer 411 is formed by any suitable means, such as by chemical vapor deposition (CVD). The nitride layer 411 is formed to a thickness of approximately 0.4 $\mu$m. A photoresist is applied and selectively exposed to mask stripes which define active device region, including both n-channel metal-oxide semiconductor (NMOS) device region 407 and PMOS device regions 405. The nitride layer 411 in between device regions, 405 and 407, is removed. The nitride layer 411 is removed by any suitable etching technique, such as by RIE. The exposed n-well 410 and the p– substrate material 400 are etched to a depth of approximately 0.2 $\mu$m below the bottom of the n-well 410/substrate 400 interface. These etching steps leave trenches 414 between the device regions 407 and 405. The etching is performed though any suitable process, such as by RIE. The structure is now as shown in FIG. 4B. The photoresist is next stripped, using conventional photoresist stripping techniques.

Figure 4C:
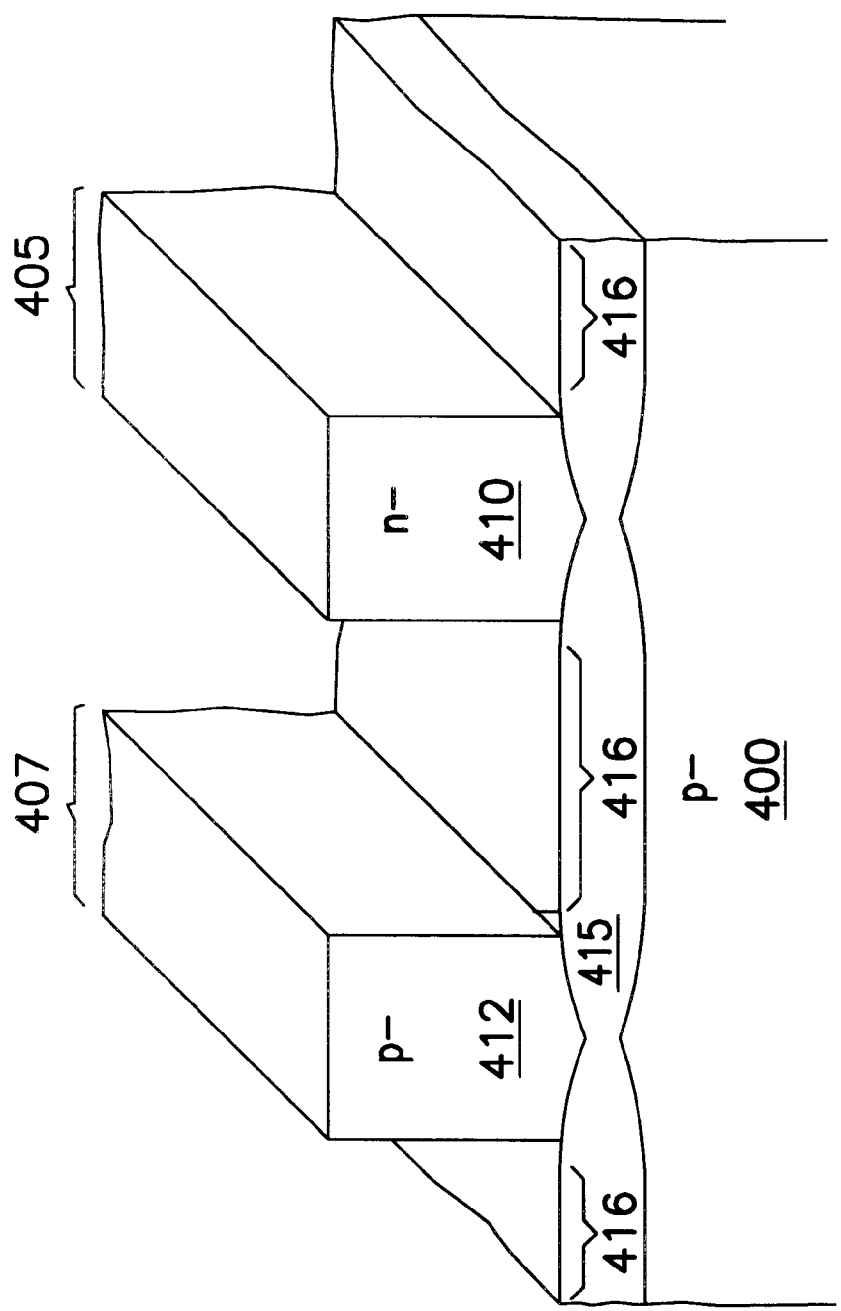

FIG. 4C illustrates the structure after the next series of processing steps. An insulator layer 415 is formed beneath the device regions, 405 and 407 respectively so as to form a semiconductor on insulator (SOI) structure. The insulator layer 415 is formed using, for example, the techniques of U.S. application Ser. No. 08/745,708 now U.S. Pat. No. 6,211,039, entitled Silicon-On-Insulator Islands and Method for Their Formation (the '708 Application), or U.S. Pat. No. 5,691,230, entitled Technique for Producing Small Islands of Silicon on Insulator (the '230 Patent). The '708 Application and the '230 Patent are incorporated by reference. The insulator layer 415 separates from substrate 400 the p– single crystalline silicon structure 412 of the NMOS device region 407, and the single crystalline silicon structure n-well 410 of the PMOS device region 405. Any of the nitride layer 411 left on the device regions, 405 and 407 is removed by etching. The etching process may be achieved either by using a selective wet etch or using reactive ion etching (RIE). The structure is now as illustrated in FIG. 4C.

Figure 4D:
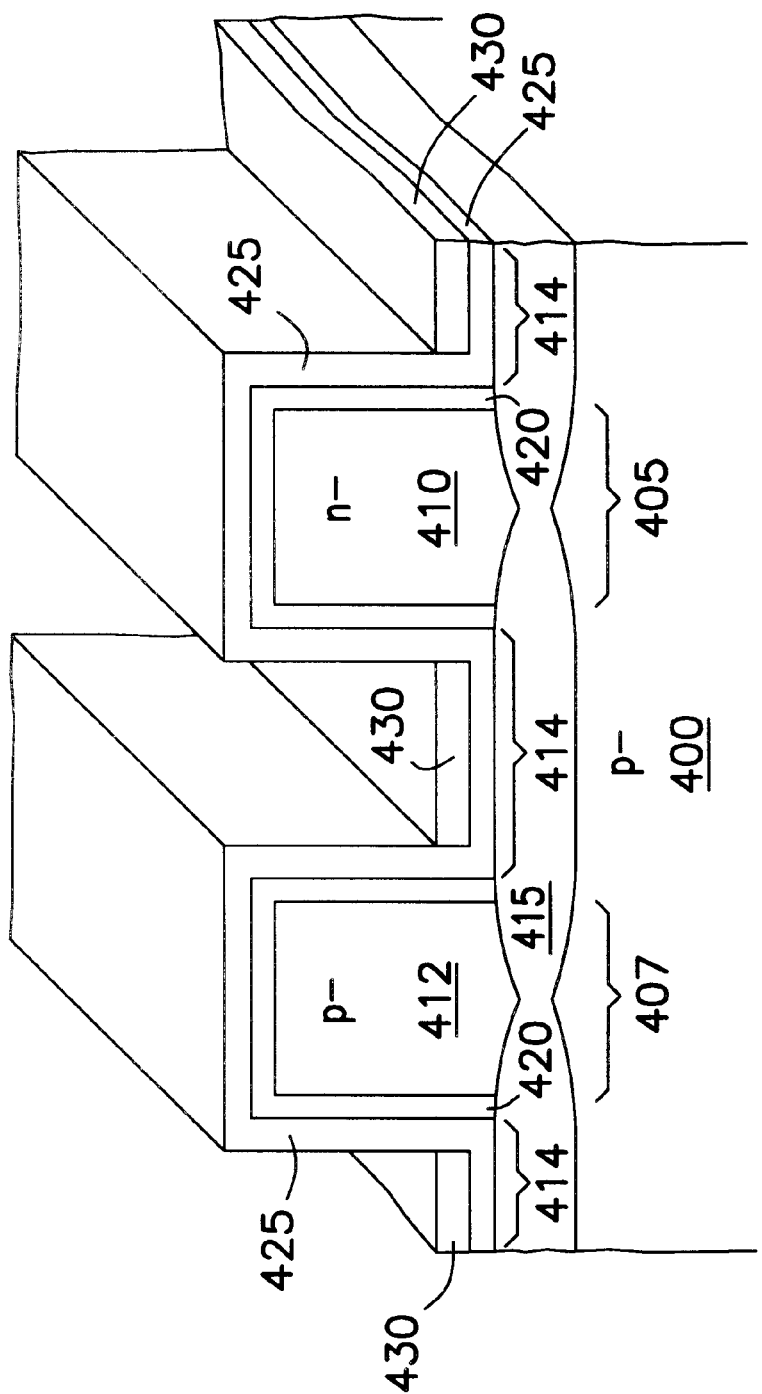

FIG. 4D illustrates the structure following the next series of processing steps. A thin oxide layer 420 is thermally grown on active device regions, 405 and 407. The oxide layer 420 is grown to a thickness of approximately 20 nanometers (nm). A thin silicon nitride ($Si_3N_4$) layer 425 is deposited over the entire surface by CVD. The nitride layer 425 is deposited to a thickness of approximately 50 nm. Intrinsic polysilicon 430 is deposited by any suitable methods, such as by CVD, to fill the trenches 414. Next, the trenches 414 are planarized stopping on the nitride pads 425. The intrinsic polysilicon 430 in trenches 414 can be planarized by any suitable process, such as by chemical mechanical polishing/planarization (CMP). The intrinsic polysilicon 430 is selectively etched back, such as by RIE, to leave only a thin layer on the bottom of trenches 414. The structure is now as is shown in FIG. 4D.

Figure 4E:
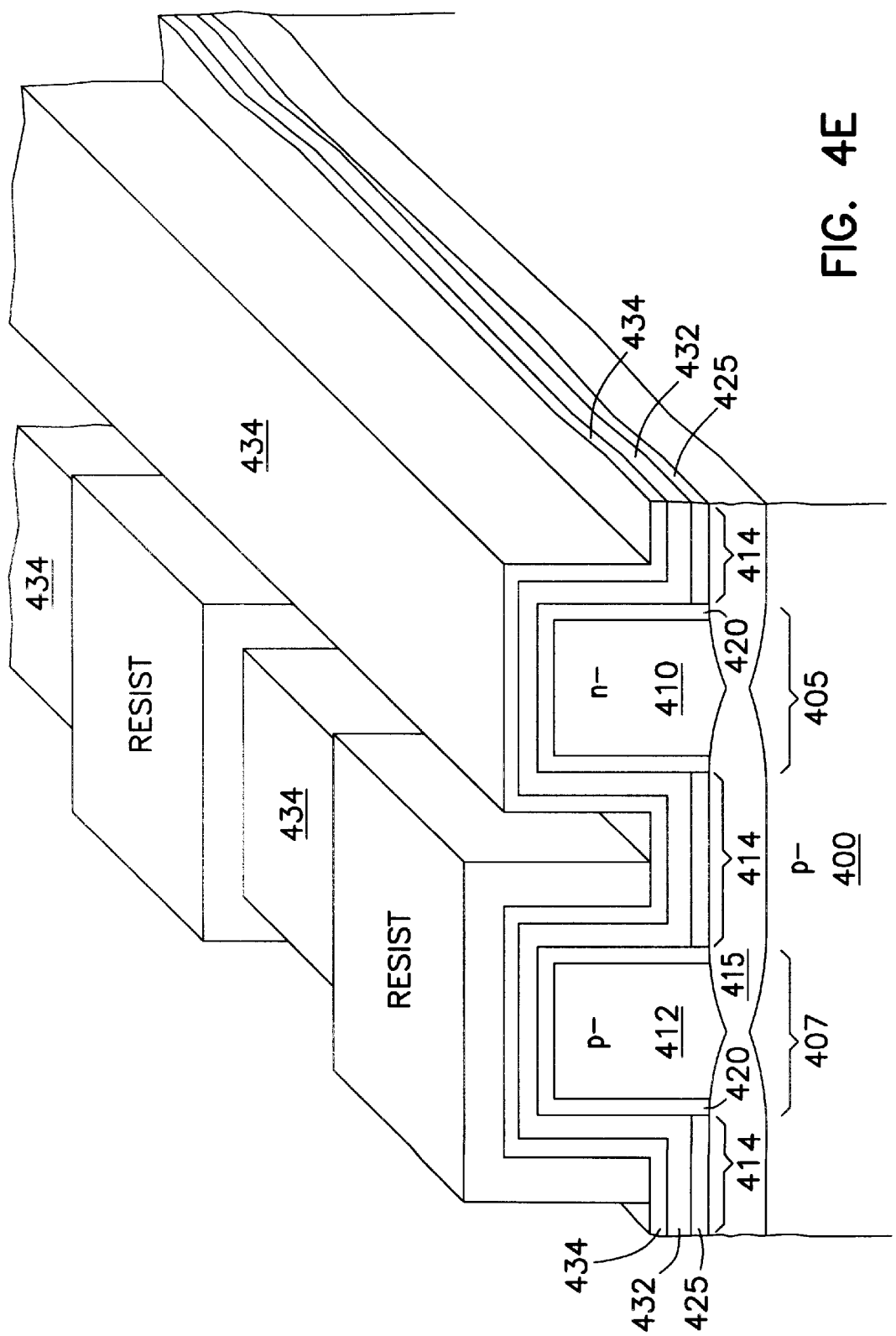

FIG. 4E shows the structure following the next sequence of processing steps. Every exposed portion of the nitride layer 425 is removed by either a selective wet etch or reactive ion etching (RIE), leaving only the nitride 425 covered by the intrinsic polysilicon 430 at the bottom of the trenches 414. The intrinsic polysilicon 430 is then removed by either a selective wet etch or reactive ion etching (RIE). The device regions, 405 and 407 respectively, remain protected by the oxide layer 420. Next, n-doped glass 432 is deposited, such a by CVD. In one embodiment the n-doped glass 432 is Arsenic silicate glass (ASG). In another embodiment, the n-doped glass 432 is phosphorus silicate glass (PSG). The n-doped glass 432 is deposited to a thickness of approximately 100 nm. A new silicon nitride ($Si_3N_4$) layer 434 is deposited over the n-doped glass 432. The new nitride layer 434 is CVD deposited to a thickness of approximately 20 nm. A photoresist is applied and selectively exposed to expose PMOS device regions 405 and to pattern the n-doped glass 432 in the NMOS device regions 407 in the form of future source/emitter and collector/drain regions. The structure is now as is shown in FIG. 4E.

Figure 4F:
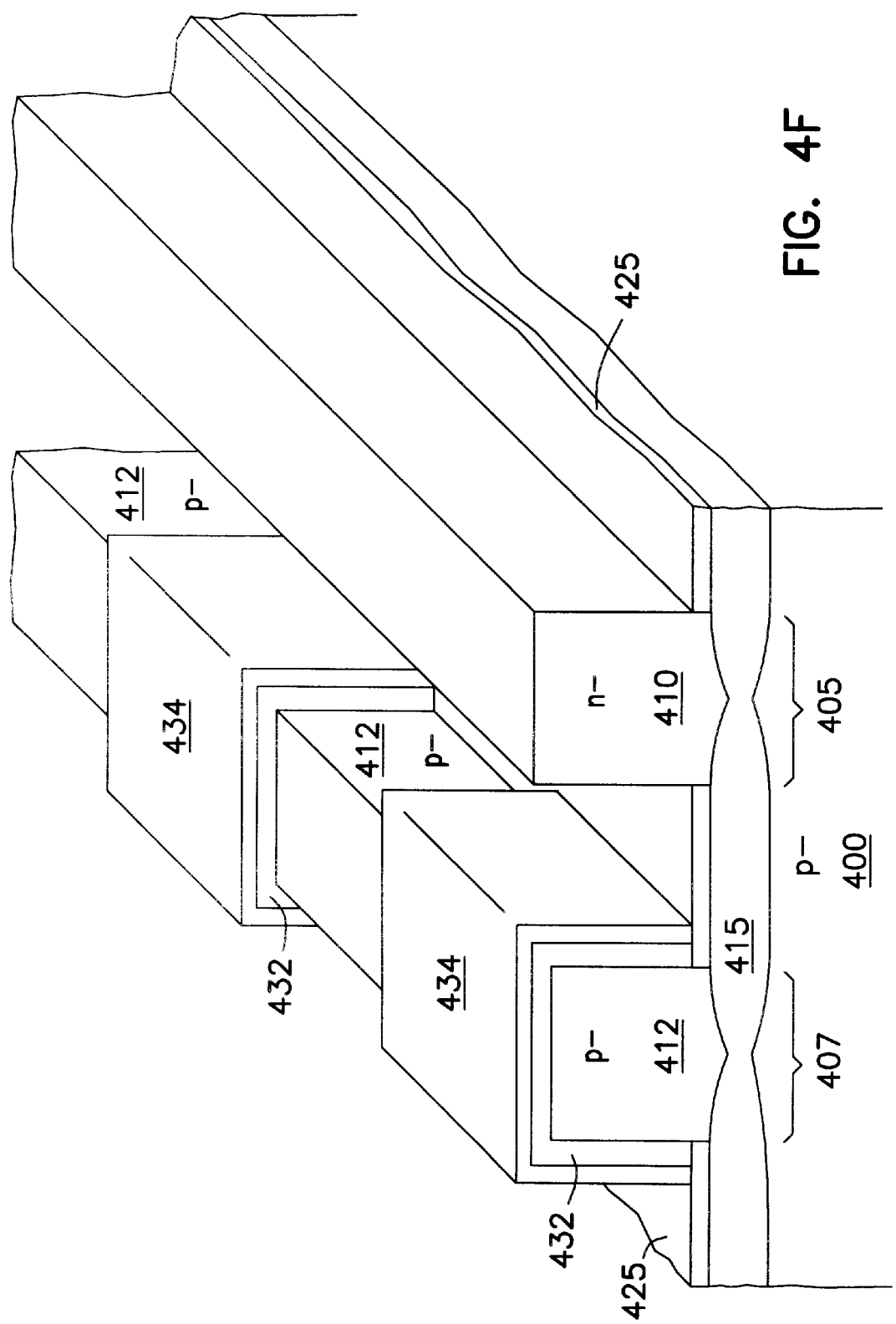

FIG. 4F illustrates the structure following the next series of process steps. The exposed nitride 434 and the underlying n-doped glass 432 are removed by any suitable means, such as by RIE. The nitride located at the bottom of the trenches 414 serves as an etch stop and protects the underlying insulator layer 415. The photoresist is stripped using conventional stripping techniques. A thin nitride layer 434 remains on the patterned n-doped glass 432 which was shielded by the photoresist. The structure is now as is shown in FIG. 4F.

Figure 4G:
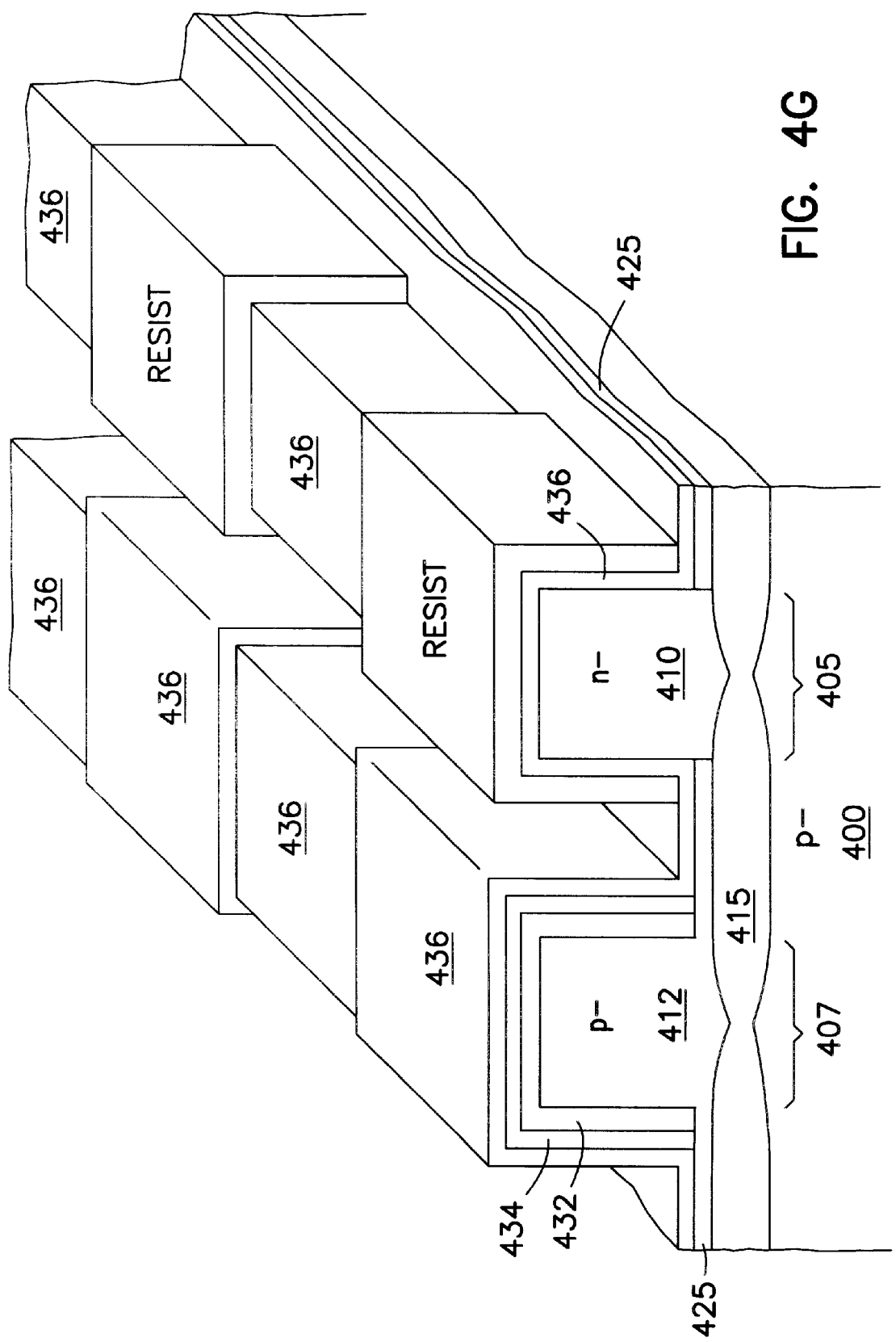

FIG. 4G illustrates the structure following the next sequence of steps. A p-doped glass 436 is deposited by any suitable means such as, for example, CVD. In one embodiment, the p-doped glass 436 is borosilicate glass (BSG). The p-doped glass 436 is deposited to a thickness of approximately 100 nm. Again, a photoresist is applied and exposed to now expose the NMOS device regions 407 and to pattern the p-doped glass 436 in the PMOS device regions 405 in the form of future source/emitter and collector/drain regions. The structure is now as is shown in FIG. 4G.

Figure 4H:
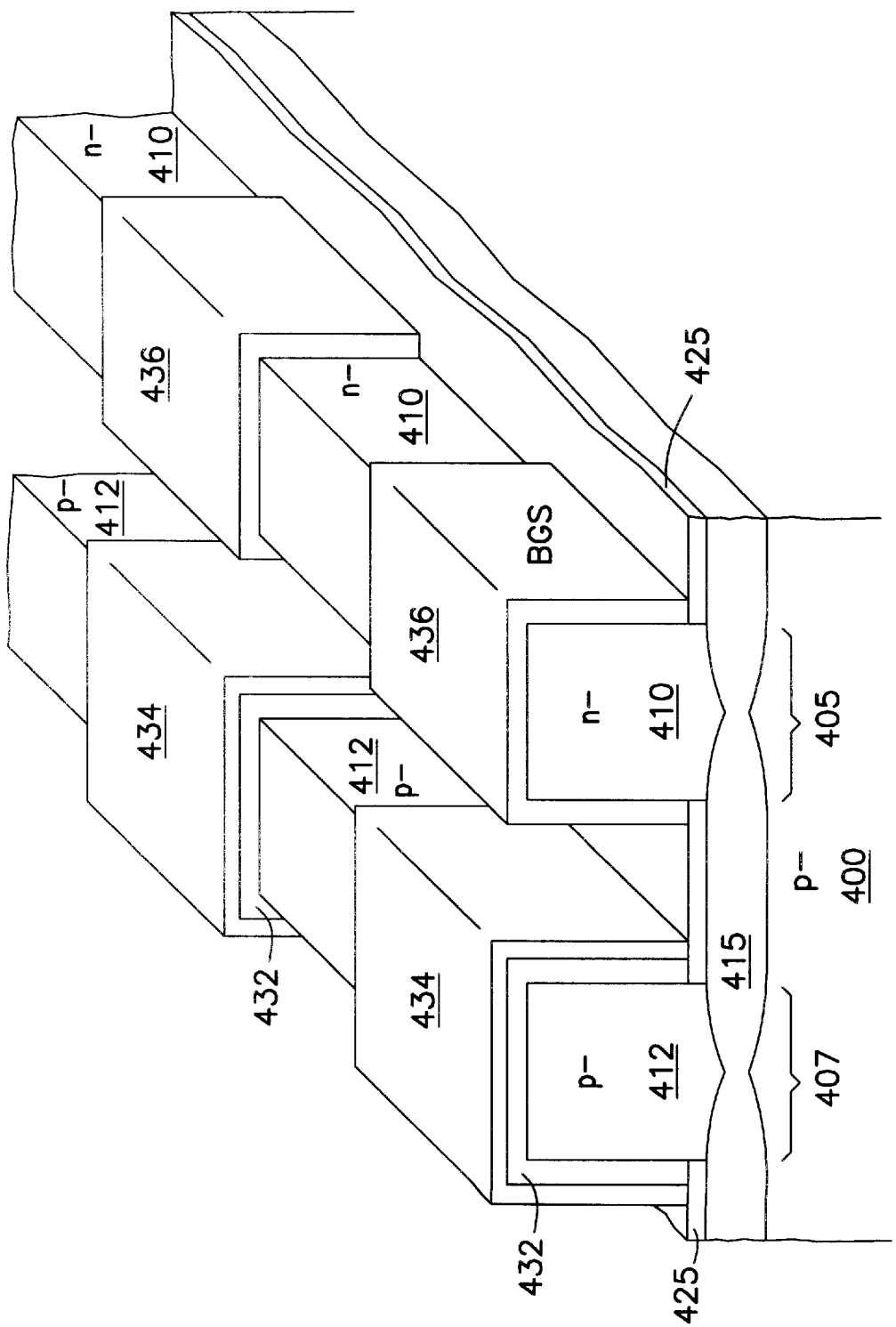
Figure 41:
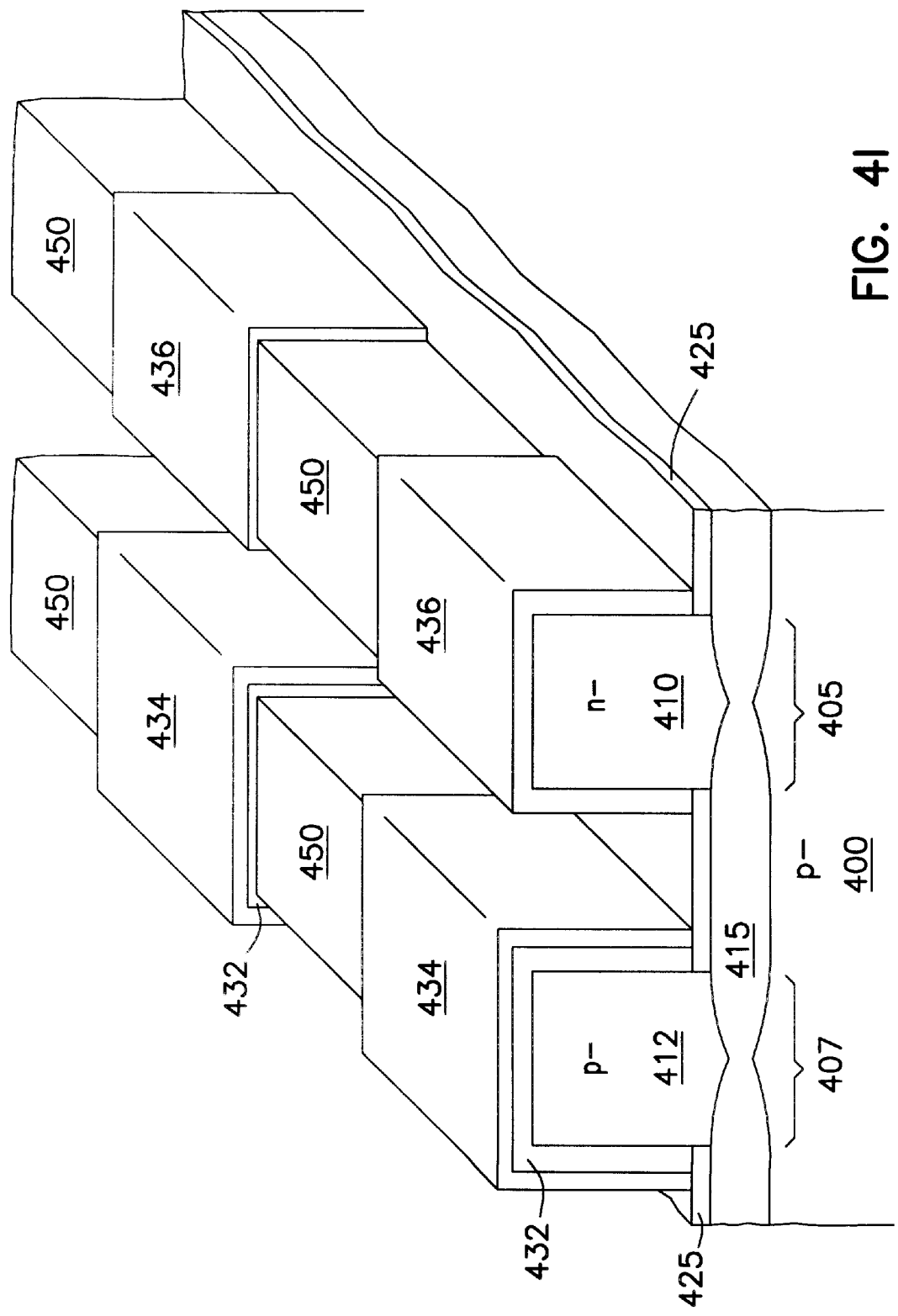

FIG. 4H illustrates the structure following the next series of process steps. The exposed p-doped glass 436 is removed by any suitable means, such as by RIE. The nitride located at the bottom of the trenches 414 again serves as an etch stop and protects the underlying insulator layer 415. Also, the thin nitride layer 434 remaining on patterned n-doped glass 432 portions serves as an etch stop and protects the regions of patterned n-doped glass 432. The photoresist is stripped using conventional stripping techniques. The structure is now as shown in FIG. 4H.

FIG. 4I provides a perspective view of the structure after next process step. In this step a gate oxide 450 is thermally grown on the p– single crystalline silicon structure 412 of the NMOS device region 407, and on the n-well single crystalline silicon structure 410 of the PMOS device region 405.

Figure 4J:
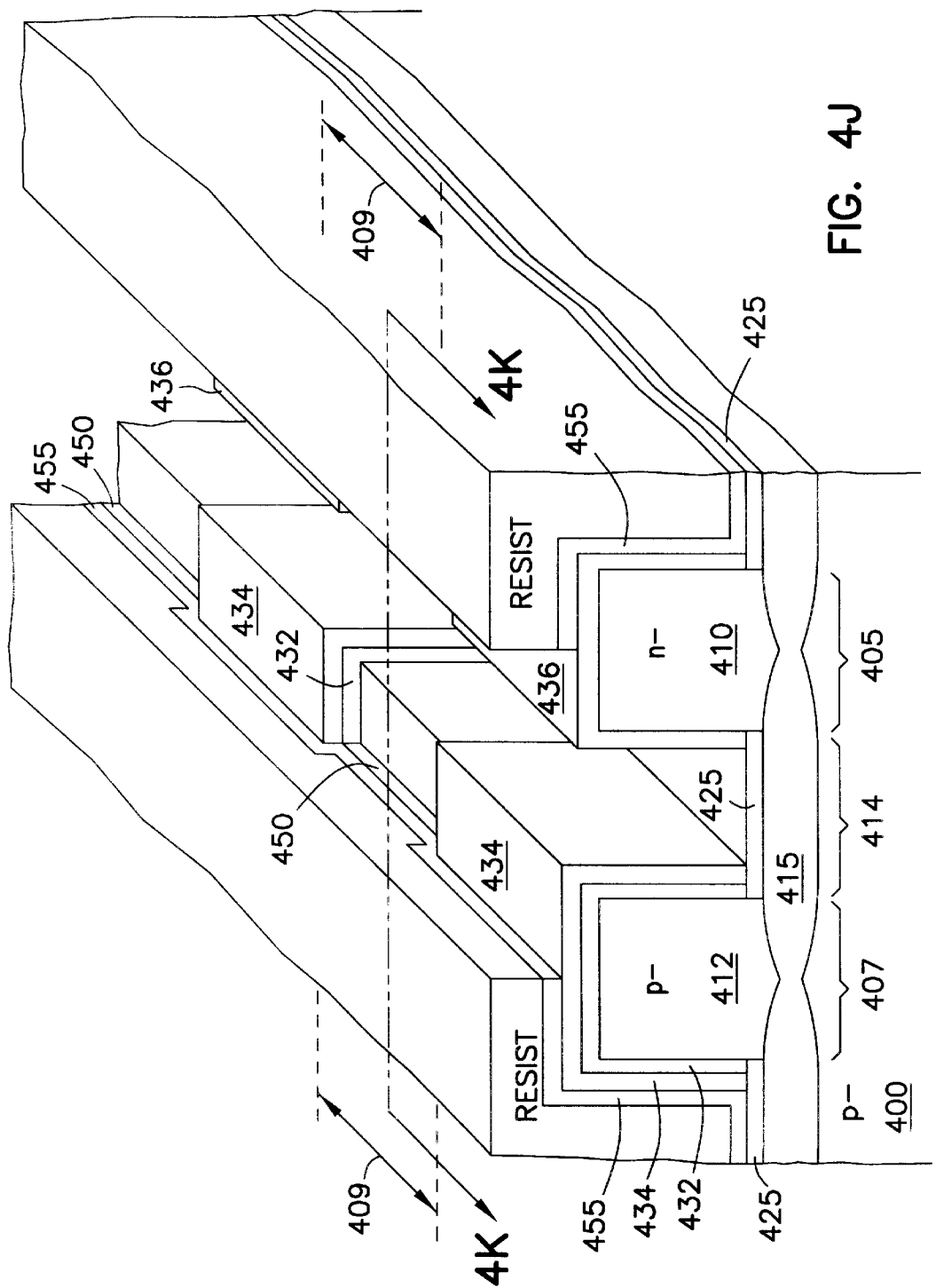

FIG. 4J carries the sequence of process steps further. In FIG. 4J, a thin intrinsic polysilicon layer 455 is deposited, such as by CVD. The intrinsic polysilicon layer 455 is formed to a thickness of approximately 20 nm. A photoresist is applied and masked to expose adjacent portion of NMOS and PMOS device regions, 407 and 405 respectively, which share a common trench 414 between the devices. The exposed intrinsic polysilicon layer 455 and the gate oxide 450 are etched back. The etching is performed by any suitable method and can be accomplished using reactive ion etching (RIE). The structure is now as appears in FIG. 4J.

Figure 4K:
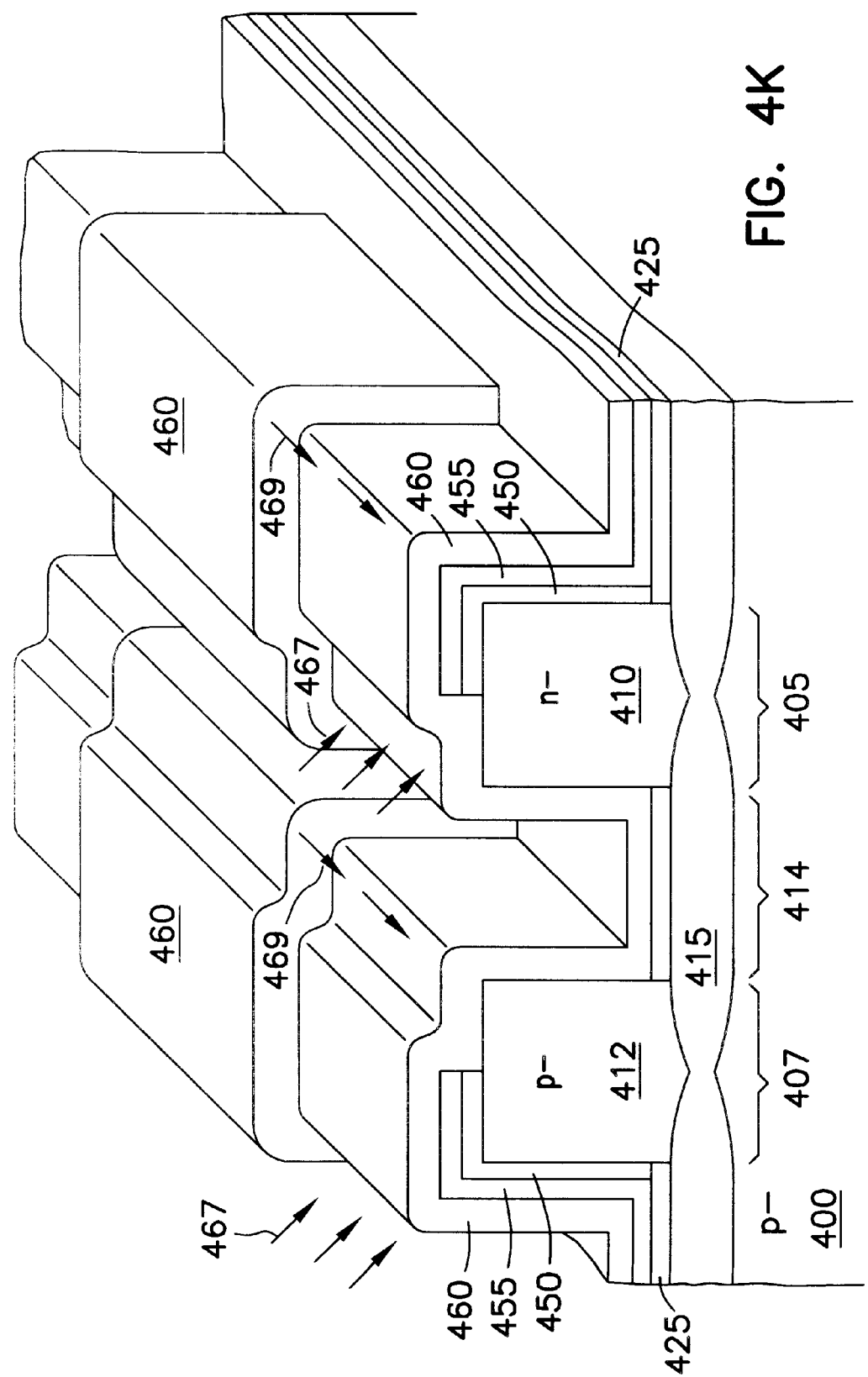

FIG. 4K illustrates the structure following the next sequence of process steps. The photoresist has been stripped using conventional photoresist stripping techniques. Now, another intrinsic polysilicon layer 460 is deposited across the entire surface. The intrinsic polysilicon layer is deposited by any suitable means, such as by CVD, to a thickness of approximately 100 nm. Next, an n-type dopant, as represented by arrows 467, is angle implanted, such as by ion implantation at an angle of 45 degrees, in order to dope the intrinsic polysilicon 460 over the gate oxide 450 in the NMOS device region 407. The n-doped polysilicon 460 acts as a gate over the gate oxide 450 in the NMOS device region. The angled ion implantation simultaneously introduces the n-type dopant into the intrinsic polysilicon 460 on the side of the n-well single crystalline silicon structure 410 opposite the gate oxide 450 side of the PMOS device region 405. The n-doped polysilicon 460 in this location acts as the body contact to the n-well single crystalline silicon structure 410. In one embodiment, the n-type dopant is Arsenic (As). In another embodiment, the n-type dopant is Phosphorus (P).

In a parallel manner, a p-type dopant, as represented by arrows 469, is angle implanted in the reciprocal direction, such as by ion implantation at an angle of 45 degrees. This step is performed in order to dope the intrinsic polysilicon 460 over the gate oxide 450 in the PMOS device region 405. The p-doped polysilicon 460 acts as a gate over the gate oxide 450 in the PMOS device region 405. The angled ion implantation simultaneously introduces the p-type dopant into the intrinsic polysilicon 460 on the side of the p– single crystalline silicon structure 412 opposite the gate oxide 450 side of the NMOS device region 407. The p-doped polysilicon 460 in this location acts as the body contact to the p– single crystalline silicon structure 412. In one embodiment, the p-type dopant is Boron (B). The structure is now as appears in FIG. 4K.

Figure 4L:
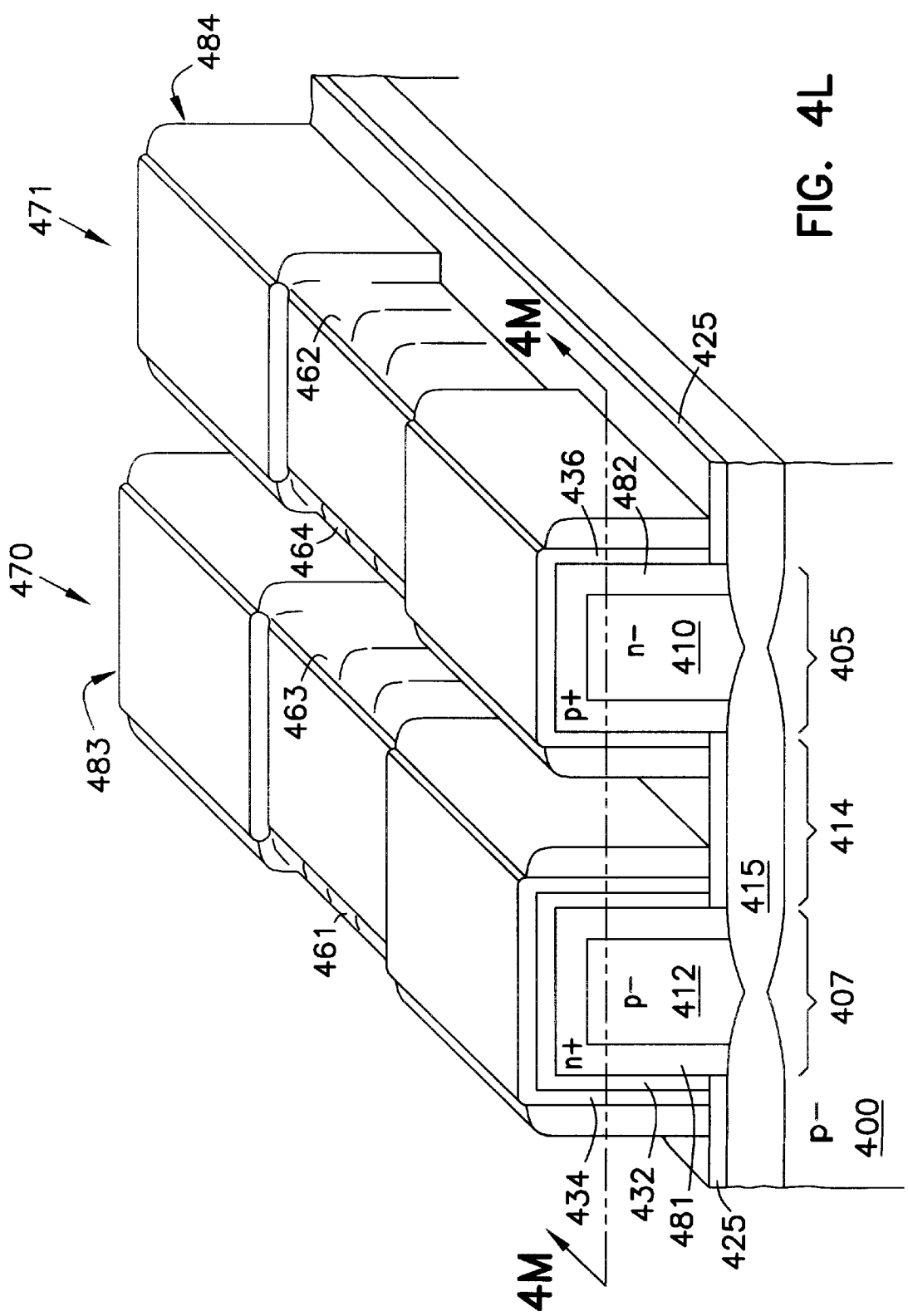

FIG. 4L illustrates the structure following the next series of process steps. Polysilicon 460 is directionally etched to leave the doped polysilicon only on the vertical side walls of the NMOS and PMOS device regions, 407 and 405 respectively. The structure then undergoes an anneal, such as a rapid thermal anneal (RTA), in order to drive the dopant species from the heavily doped polysilicon 460 into the underlying, undoped polysilicon 455. The anneal also serves to drive the dopant into the n-well single crystalline silicon structure 410 and the p– single crystalline silicon structure 412 from the p-doped glass 436 and the n-doped glass 432 respectively. As one skilled in the art will appreciate, the anneal process also cures out the crystal damage induced by the previous ion implant processes. FIG. 4L illustrates that the anneal step has merged the once separate doped polysilicon layer 460 and undoped polysilicon layer 455. In effect, the anneal step forms a heavily doped n+ gate 461 in the NMOS device region 407, and forms a heavily doped p+ gate 462 in the PMOS device region 405. In the same fashion, the anneal step forms a heavily doped n+ body contact 464 in the PMOS device region 405, and forms a heavily doped p+ body contact 463 in the NMOS device region 407.

Figure 4M:
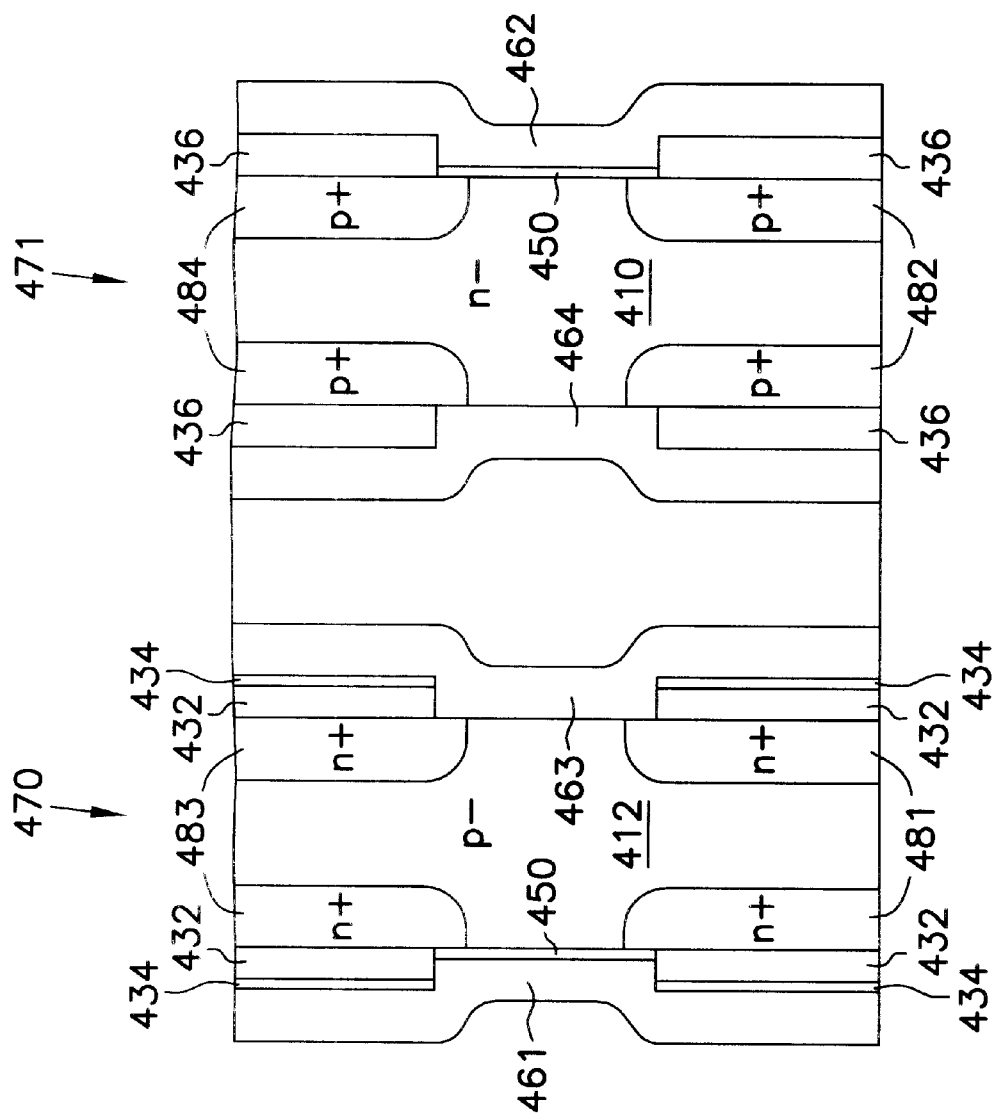

FIG. 4L further provides a broader perspective and illustrates full length NMOS and PMOS devices, 470 and 471 respectively. FIG. 4L illustrates the location of the newly formed source/emitter regions, 481 and 482, and the collector/drain regions, 483 and 484, for the NMOS and PMOS devices, 470 and 471. FIG. 4M is a top view of FIG. 4L taken along cut line 4M—4M.

Finally, in a final sequence of processing steps, and following conventional method, a photoresist is applied and masked to expose any vertical walls where polysilicon, 461 or 462, is to be removed to terminate gate lines. Such polysilicon, 461 or 462 is then etched back by any suitable method, such as by RIE. The photoresist is stripped using conventional photoresist stripping techniques. An oxide or other insulator is deposited and planarized to fill the trenches 414 between the NMOS and PMOS devices, 470 and 471 respectively. The insulator deposition is performed by any suitable method, such as by CVD. The planarization is also achieved by any suitable technique, such as by CMP.

Contact holes and wiring for both the gate contact and the electrical contact are achieved through conventional processing steps. One skilled in the art will recognize the method to these steps and, hence, they are not disclosed as part of this application.

Conclusion

A CMOS inverter is provided, capable of combination with similar inverters to form an inverter array. The array of inverters can be further combined with a metallization layer to form a logic circuit and to external components to form a functional circuit. The present invention conserves surface space achieves a higher density of surface structures per chip. The structures offer performance advantages from both metal-oxide semiconductor (MOS) and bipolar junction transistor (BJT) designs. The devices can be used in a variety of applications, digital and analog, wherever a more compact structure with low power consumption and fast response time is needed.

It is to be understood that the above description is intended to be illustrative, and not restrictive. Combinations of the above embodiments, and other embodiments will be apparent to those of skill in the art upon reviewing the above description. The above structures and fabrication methods have been described, by way of example, and not by way of limitation, with respect to the transistors and inverters. However, the scope of the invention includes any other integrated circuit applications in which the above structures and fabrication methods are used. Thus, the scope of the invention is not limited to the particular embodiments shown and described herein. The scope of the invention should be determined with reference to the appended claims, along with the full scope of equivalents to which such claims are entitled.

What is claimed is:

1. A method of fabricating an inverter, the method comprising:

forming a first transistor, the first transistor extending outwardly from a semiconductor substrate, the first transistor having an upper surface and opposing sidewall surfaces, the first transistor having a source/emitter region, a body/base region, and having a collector/drain region;

forming a second transistor, the second transistor extending outwardly from a semiconductor substrate, the second transistor having an upper surface and opposing sidewall surfaces, the second transistor having a source/emitter region, a body/base region, and having a collector/drain region;

forming a third transistor, the third transistor extending outwardly from a semiconductor substrate, the third transistor having an upper surface and opposing sidewall surfaces, the third transistor having a source/emitter region, a body/base region, and having a collector/drain region;

forming a fourth transistor, the fourth transistor extending outwardly from a semiconductor substrate, the fourth transistor having an upper surface and opposing sidewall surfaces, the fourth transistor having a source/emitter region, a body/base region, and having a collector/drain region;

such that the transistors give both metal oxide semiconductor (MOS) type conduction and bipolar junction transistor (BJT) type conduction;

forming an electrical contact between collector/drain regions of the second and third transistors to provide an output for the inverter; and forming a gate contact, the gate contact interconnecting the transistors wherein the gate contact provides an input to the inverter.

2. The method of fabricating an inverter of claim 1, the method further comprising:

forming the first transistor to have a gate on a first one of the opposing sidewall surfaces, and forming a body contact on a second one of the opposing sidewall surfaces of the first transistor;

forming the second transistor to have a gate on a first one of the opposing sidewall surfaces, and forming a body contact on a second one of the opposing sidewall surfaces of the second transistor;

forming the third transistor have a gate on a first one of the opposing sidewall surfaces, and forming a body contact on a second one of the opposing sidewall surfaces of the third transistor; and forming the fourth transistor to have a gate on a first one of the opposing sidewall surfaces, and forming a body contact on a second one of the opposing sidewall surfaces of the fourth transistor.

3. The method of fabricating an inverter of claim 2, wherein forming the body contacts includes forming the body contacts to be more highly doped than the body/base regions.

4. The method of fabricating an inverter of claim 1, wherein forming the transistors includes forming the transistors on an insulator layer formed on a p− silicon substrate.

5. The method of fabricating an inverter of claim 2, wherein forming the body contacts for the first and fourth transistors includes coupling the body contact to the gates of the first and fourth transistors.

6. The method of fabricating an inverter of claim 1, wherein forming the first and fourth transistors includes forming the first and fourth transistors to have a higher threshold voltage level than the second and third transistors.

7. The method of fabricating an inverter of claim 2, wherein forming the body contacts for the second and third transistors includes forming the body contacts to be biased independently from the gates of the second and third transistors.

8. The method of fabricating an inverter of claim 1, wherein forming the first and second transistors includes forming n-channel metal-oxide semiconductor (NMOS) transistors, and forming the third and fourth transistors includes forming p-channel metal-oxide semiconductor (PMOS) transistors.

9. A method of fabricating a logic circuit, comprising:

forming multiple inverters in an array, wherein forming each inverter comprises:

forming a first transistor, the first transistor extending outwardly from a semiconductor substrate, the first transistor having an upper surface and opposing sidewall surfaces, the first transistor having a source/emitter region, a body/base region, and having a collector/drain region;

forming a second transistor, the second transistor extending outwardly from a a semiconductor substrate, the second transistor having an upper surface and opposing sidewall surfaces, the second transistor having a source/emitter region, a body/base region, and having a collector/drain region;

forming a third transistor, the third transistor extending outwardly from a semiconductor substrate, the third transistor having an upper surface and opposing sidewall surfaces, the third transistor having a source/emitter region, a body/base region, and having a collector/drain region;

forming a fourth transistor, the fourth transistor extending outwardly from a semiconductor substrate, the fourth transistor having an upper surface and opposing sidewall surfaces, the fourth transistor having a source/emitter region, a body/base region, and having a collector/drain region;

forming an electrical contact between collector/drain regions of the second and third transistors to provide an output for the inverter;

forming a gate contact, the gate contact interconnecting the transistors wherein the gate contact provides an input to the inverter; and forming a metallization layer that selectively interconnects the inputs and outputs of the inverters to implement a selected logic function that accepts inputs and produces one or more logical outputs.

10. The method of fabricating a logic circuit of claim 9, wherein forming the transistors includes forming the transistors on an insulator layer formed on a p− silicon substrate.

11. The method of fabricating a logic circuit of claim 9, wherein forming the first and second transistors includes forming n-channel metal-oxide semiconductor (NMOS) transistors, and forming the third and fourth transistors includes forming p-channel metal-oxide semiconductor (PMOS) transistors.

12. A method of fabricating a logic circuit, comprising:

forming multiple inverters in an array, wherein forming each inverter comprises:

forming a first transistor, the first transistor extending outwardly from a semiconductor substrate, the first transistor having an upper surface and a gate on a first opposing sidewall surface, and a body contact on a second opposing sidewall surface, the first transistor having a source/emitter region, a body/base region, and having a collector/drain region;

forming a second transistor, the second transistor extending outwardly from a semiconductor substrate, the second transistor having an upper surface and a gate on a first opposing sidewall surface, and a body contact on a second opposing sidewall surface, the second transistor having a source/emitter region, a body/base region, and having a collector/drain region;

forming a third transistor, the third transistor extending outwardly from a semiconductor substrate, the third transistor having an upper surface and a gate on a first opposing sidewall surface, and a body contact on a second opposing sidewall surface, the third transistor having a source/emitter region, a body/base region, and having a collector/drain region;

forming a fourth transistor, the fourth transistor extending outwardly from a semiconductor substrate, the fourth transistor having an upper surface and a gate on a first opposing sidewall surface, and a body contact on a second opposing sidewall surface, the fourth transistor having a source/emitter region, a body/base region, and having a collecter/drain region:

forming an electrical contact between collector/drain regions of the second and third transistors to provide an output for the inverter;

forming a gate contact, the gate contact interconnecting the transistors wherein the gate contact provides an input to the inverter; and forming a metallization layer that selectively interconnects the inputs and outputs of the inverters to implement a selected logic function that accepts inputs and produces one or more logical outputs.

13. The method of fabricating a logic circuit of claim 12, wherein forming the body contacts for the first and fourth transistors includes coupling the body contact to the gates of the first and fourth transistors.

14. The method of fabricating a logic circuit of claim 12, wherein forming the body contacts for the second and third transistors includes forming the body contacts to be biased independently from the gates of the second and third transistors.

15. The method of fabricating a logic circuit of claim 12, wherein forming the body contacts includes forming the body contacts to be more highly doped than the body/base regions.

16. A method of fabricating an input/output device, comprising:

forming a functional circuit having a plurality of components;

forming a logic device coupled to the functional circuit, the logic device having a number of inverters, each inverter comprising:

forming a first transistor, the first transistor extending outwardly from a semiconductor substrate, the first transistor having an upper surface and opposing sidewall surfaces, the first transistor having a source/emitter region, a body/base region, and having a collector/drain region;

forming a second transistor, the second transistor extending outwardly from a semiconductor substrate, the second transistor having an upper surface and opposing sidewall surfaces, the second transistor having a source/emitter region, a body/base region, and having a collector/drain region;

forming a third transistor, the third transistor extending outwardly from a semiconductor substrate, the third transistor having an upper surface and opposing sidewall surfaces, the third transistor having a source/emitter region, a body/base region, and having a collector/drain region;

forming a fourth transistor, the fourth transistor extending outwardly from a semiconductor substrate, the fourth transistor having an upper surface and opposing sidewall surfaces, the fourth transistor having a source/emitter region, a body/base region, and having a collector/drain region;

forming an electrical contact between collector/drain regions of the second and third transistors to provide an output for the inverter;

forming a gate contact, the gate contact interconnecting the transistors wherein the gate contact provides an input to the inverter; and forming a metallization layer that selectively interconnects the inputs and outputs of the inverters to implement a selected logic function that accepts inputs and produces one or more logical outputs.

17. The method of fabricating an input/output device of claim 16, wherein forming the transistors includes forming the transistors on an insulator layer formed on a p- silicon substrate.

18. The method of fabricating an input/output device of claim 16, wherein forming the first and second transistors includes forming n-channel metal-oxide semiconductor (NMOS) transistors, and forming the third and fourth transistors includes forming p-channel metal-oxide semiconductor (PMOS) transistors.

19. The method of fabricating an input/output device of claim 16, wherein the functional circuit includes a memory controller.

20. The method of fabricating an input/output device of claim 16, wherein the functional circuit includes a microprocessor.

21. A method of fabricating an input/output device, comprising:

forming a functional circuit having a plurality of components;

forming a logic device coupled to the functional circuit, the logic device having a number of inverters, each inverter comprising:

forming a first transistor, the first transistor extending outwardly from a semiconductor substrate, the first transistor having an upper surface and a gate on a first opposing sidewall surface, and a body contact on a second opposing sidewall surface, the first transistor having a source/emitter region, a body/base region, and having a collector/drain region;

forming a second transistor, the second transistor extending outwardly from a semiconductor substrate, the second transistor having an upper surface and a gate on a first opposing sidewall surface, and a body contact on a second opposing sidewall surface, the second transistor having a source/emitter region, a body/base region, and having a collector/drain region;

forming a third transistor, the third transistor extending outwardly from a semiconductor substrate, the third transistor having an upper surface and a gate on a first opposing sidewall surface, and a body contact on a second opposing sidewall surface, the third transistor having a source/emitter region, a body/base region, and having a collector/drain region;

forming a fourth transistor, the fourth transistor extending outwardly from a semiconductor substrate, the fourth transistor having an upper surface and a gate on a first opposing sidewall surface, and a body contact on a second opposing sidewall surface, the fourth transistor having a source/emitter region, a body/base region, and having a collector/drain region;

forming an electrical contact between collector/drain regions of the second and third transistors to provide an output for the inverter;

forming a gate contact, the gate contact interconnecting the transistors wherein the gate contact provides an input to the inverter; and forming a metallization layer that selectively interconnects the inputs and outputs of the inverters to implement a selected logic function that accepts inputs and produces one oe more logical outputs.

22. The method of fabricating an input/output device of claim 21, wherein forming the body contacts for the first and fourth transistors includes coupling the body contact to the gates of the first and fourth transistors.

23. The method of fabricating an input/output device of claim 21, wherein forming the body contacts for the second and third transistors includes forming the body contacts to be biased independently from the gates of the second and third transistors.

24. The method of fabricating an input/output device of claim 21, wherein forming the body contacts includes forming the body contacts to be more highly doped than the body/base regions.

25. A method of fabricating a logic circuit, comprising:

forming multiple inverters in an array, wherein forming each inverter comprises:

forming a first transistor, the first transistor extending outwardly from a semiconductor substrate, the first transistor having an upper surface and a gate on a first opposing sidewall surface, and a body contact on a second opposing sidewall surface, the first transistor having a source/emitter region, a body/base region, and having a collector/drain region;

forming a second transistor, the second transistor extending outwardly from a semiconductor substrate, the second transistor having an upper surface and a gate on a first opposing sidewall surface, and a body contact on a second opposing sidewall surface, the second transistor having a source/emitter region, a body/base region, and having a collector/drain region;

forming a third transistor, the third transistor extending outwardly from a semiconductor substrate, the third transistor having an upper surface and a gate on a first opposing sidewall surface, and a body contact on a second opposing sidewall surface, the third transistor having a source/emitter region, a body/base region, and having a collector/drain region;

forming a fourth transistor, the fourth transistor extending outwardly from a semiconductor substrate, the fourth transistor having an upper surface and a gate on a first opposing sidewall surface, and a body contact on a second opposing sidewall surface, the fourth transistor having a source/emitter region, a body/base region, and having a collector/drain region;

doping the body/base region of the first and fourth transistor to provide a threshold voltage ($V_t$) that is higher than the threshold voltage of the second and third transistor;

forming an electrical contact between collector/drain regions of the second and third transistors to provide an output for the inverter;

forming a gate contact, the gate contact interconnecting the transistors wherein the gate contact provides an input to the inverter; and forming a metallization layer that selectively interconnects the inputs and outputs of the inverters to implement a selected logic function that accepts inputs and produces one or more logical outputs.

26. The method of fabricating a logic circuit of claim 25, wherein forming the transistors includes forming the transistors on an insulator layer formed on a p- silicon substrate.

27. The method of fabricating a logic circuit of claim 25, wherein forming the first and second transistors includes forming n-channel metal-oxide semiconductor (NMOS) transistors, and forming the third and fourth transistors includes forming p-channel metal-oxide semiconductor (PMOS) transistors.

28. A method of fabricating an input/output device, comprising:

forming a functional circuit having a plurality of components;

forming a logic device coupled to the functional circuit, the logic device having a number of inverters, each inverter comprising:

forming a first transistor, the first transistor extending outwardly from a semiconductor substrate, the first transistor having an upper surface and a gate on a first opposing sidewall surface, and a body contact on a second opposing sidewall surface, the first transistor having a source/emitter region, a body/base region, and having a collector/drain region;

forming a second transistor, the second transistor extending outwardly from a semiconductor substrate, the second transistor having an upper surface and a gate on a first opposing sidewall surface, and a body contact on a second opposing sidewall surface, the second transistor having a source/emitter region, a body/base region, and having a collector/drain region;

forming a third transistor, the third transistor extending outwardly from a semiconductor substrate, the third transistor having an upper surface and a gate on a first opposing sidewall surface, and a body contact on a second opposing sidewall surface, the third transistor having a source/emitter region, a body/base region, and having a collector/drain region;

forming a fourth transistor, the fourth transistor extending outwardly from a semiconductor substrate, the fourth transistor having an upper surface and a gate on a first opposing sidewall surface, and a body contact on a second opposing sidewall surface, the fourth transistor having a source/emitter region, a body/base region, and having a collector/drain region;

doping the body/base region of the first and fourth transistor to provide a threshold voltage ($V_t$) that is higher than the threshold voltage of the second and third transistor;

forming an electrical contact between collector/drain regions of the second and third transistors to provide an output for the inverter;

forming a gate contact, the gate contact interconnecting the transistors wherein the gate contact provides an input to the inverter; and forming a metallization layer that selectively interconnects the inputs and outputs of the inverters to implement a selected logic function that accepts inputs and produces one or more logical outputs.

29. The method of fabricating an input/output device of claim 28, wherein forming the body contacts for the first and fourth transistors includes coupling the body contact to the gates of the first and fourth transistors.

30. The method of fabricating an input/output device of claim 28, wherein forming the body contacts for the second and third transistors includes forming the body contacts to be biased independently from the gates of the second and third transistors.

31. The method of fabricating an input/output device of claim 28, wherein forming the body contacts includes forming the body contacts to be more highly doped than the body/base regions.

32. The method of fabricating an input/output device of claim 28, wherein the functional circuit includes a memory controller.

33. The method of fabricating an input/output device of claim 28, wherein the functional circuit includes a microprocessor.

* * * * *

UNITED STATES PATENT AND TRADEMARK OFFICE
CERTIFICATE OF CORRECTION

PATENT NO. : 6,340,612 B1
DATED : January 22, 2002
INVENTOR(S) : Noble et al.

It is certified that error appears in the above-identified patent and that said Letters Patent is hereby corrected as shown below:

Column 13,
Line 29, delete "such that the transistors give both metal oxide semiconductors (MOS) type conduction and bipolar junction transistor (BJT) type conduction;".

Signed and Sealed this

Twentieth Day of August, 2002

Attest:

Attesting Officer

JAMES E. ROGAN
Director of the United States Patent and Trademark Office